(12) United States Patent
Stamate

(10) Patent No.: US 12,170,194 B2
(45) Date of Patent: Dec. 17, 2024

(54) MAGNETRON PLASMA SPUTTERING ARRANGEMENT

(71) Applicant: Danmarks Tekniske Universitet, Kongens Lyngby (DK)

(72) Inventor: Eugen Stamate, Roskilde (DK)

(73) Assignee: DANMARKS TEKNISKE UNIVERSITET, Kongens Lyngby (DK)

(*) Notice: Subject to any disclaimer, the term of this patent is extended or adjusted under 35 U.S.C. 154(b) by 76 days.

(21) Appl. No.: 17/761,084

(22) PCT Filed: Sep. 17, 2020

(86) PCT No.: PCT/EP2020/076047
§ 371 (c)(1),
(2) Date: Mar. 16, 2022

(87) PCT Pub. No.: WO2021/053115
PCT Pub. Date: Mar. 25, 2021

(65) Prior Publication Data
US 2022/0351952 A1    Nov. 3, 2022

(30) Foreign Application Priority Data
Sep. 18, 2019  (DK) ............................ PA 201970572

(51) Int. Cl.
*H01J 37/34*      (2006.01)
*C23C 14/35*     (2006.01)

(52) U.S. Cl.
CPC .......... *H01J 37/3405* (2013.01); *C23C 14/35* (2013.01); *H01J 37/3417* (2013.01); *H01J 37/3447* (2013.01)

(58) Field of Classification Search
CPC ............... H01J 37/3405; H01J 37/3417; H01J 37/3447; H01J 37/3438; H01J 37/3473;
(Continued)

(56) References Cited

U.S. PATENT DOCUMENTS

| 3,528,906 A | * | 9/1970 | Cash, Jr. ................. H01L 21/00 |
| | | | 204/298.26 |
| 5,114,556 A | * | 5/1992 | Lamont, Jr. ......... H01L 21/0217 |
| | | | 257/E21.585 |

(Continued)

FOREIGN PATENT DOCUMENTS

| EP | 1 172 838 A2 | 1/2002 |
| EP | 2 197 043 A1 | 6/2010 |

(Continued)

OTHER PUBLICATIONS

Machine Translation JP10-280143 (Year: 1998).*
(Continued)

*Primary Examiner* — Rodney G McDonald
(74) *Attorney, Agent, or Firm* — Crowell & Moring LLP; John C. Freeman

(57) ABSTRACT

A magnetron plasma sputtering arrangement including an evacuable chamber, wherein in the evacuable chamber a tuning electrode, operatively connected to a biasing source with respect to ground, and including an aperture defining at least one axis of length, is arranged in a flow path for plasma between a sputtering head and a substrate. A plasma sputtered material originating at a sputtering target will traverse the aperture before depositing onto the surface of the substrate as a thin film.

14 Claims, 18 Drawing Sheets

(58) Field of Classification Search
CPC ..... C23C 14/35; C23C 14/086; C23C 14/354; C23C 14/54
USPC ........................................ 204/298.06, 298.11
See application file for complete search history.

(56) References Cited

U.S. PATENT DOCUMENTS

| | | | |
|---|---|---|---|
| 5,635,036 A * | 6/1997 | Demaray | ............... C23C 14/35 |
| | | | 204/192.12 |
| 5,891,311 A | 4/1999 | Lewis et al. | |
| 6,132,805 A * | 10/2000 | Moslehi | ............ H01J 37/32642 |
| | | | 204/298.11 |
| 7,947,531 B1 | 5/2011 | Chiang | |
| 8,974,649 B2 * | 3/2015 | Shao | ....................... C23C 14/34 |
| | | | 204/298.11 |
| 2002/0023832 A1 | 2/2002 | Hong | |
| 2009/0061108 A1 | 3/2009 | Endo et al. | |
| 2010/0206713 A1 | 8/2010 | Li et al. | |
| 2014/0124359 A1 | 5/2014 | Shao et al. | |
| 2014/0170338 A1 | 6/2014 | Ding et al. | |
| 2015/0176117 A1 | 6/2015 | Fong et al. | |

FOREIGN PATENT DOCUMENTS

| | | |
|---|---|---|
| EP | 3 249 676 A1 | 11/2017 |
| JP | H10-280143 A | 10/1998 |
| JP | 2018-83971 A | 5/2018 |
| WO | WO 98/59088 A1 | 12/1998 |
| WO | WO 2014/142737 A1 | 9/2014 |
| WO | WO 2015/025823 A1 | 2/2015 |

OTHER PUBLICATIONS

International Search Report dated Dec. 4, 2020 (3 pages) from PCT Priority Application PCT/EP2020/076047.

Written Opinion of the International Searching Authority dated Dec. 4, 2020 (8 pages) from PCT Priority Application PCT/EP2020/076047.

International Preliminary Report on Patentability dated Mar. 15, 2022 (9 pages) from PCT Priority Application PCT/EP2020/076047.

A. Bikowski, T. Welzel, Klaus Ellmer, *The impact of negative oxygen ion bombardment of electronic and structural properties of magnetron sputtered ZnO:Al films*, Applied Physics Letters, vol. 102, pp. 242106-1 to 242106-4 (Jun. 18, 2013) (5 pages).

A. Bikowski, T. Welzel, Klaus Ellmer, *The correlation between the radial distribution of high-energetic ions and the structural as well as electrical properties of magnetron sputtered ZnO:Al films*, Journal of Applied Physics, vol. 114, pp. 223716-1 to 223716-10 (Dec. 12, 2013) (11 pages).

M. Mickan, U. Helmesson, H. Rinnert, J. Ghanbaja, D. Muller, D. Horwat, *Room temperature deposition of homogenous, highly transparent and conductive Al-doped ZnO films by reactive high power impulse magnetron sputtering*, Solar Energy Materials & Solar Cells, vol. 157, pp. 742-749 (Aug. 8, 2016).

V. Tiron, L. Sirghi, G. Popa, *Control of aluminium doping of ZnO:Al thin films obtained by high-power impulse magnetron sputtering*, Thin Solid Films, vol. 520 No. 13, pp. 4305-4309 (Feb. 28, 2012) (5 pages).

M. Mickan, *Deposition of Al-doped ZnO films by high power impulse magnetron sputtering*, Linköping University Studies in Science and Technology, Dissertation No. 1889, printed by LiU-Tryck, Linköping, Sweden (2017) (108 pages).

N-J. Choi, K-W. Kim, H-S. Son, S-N. Lee, *Optical and Electrical Characterization of AZO Films Grown on c-Plane Sapphire Substrates by Atomic Layer Deposition*, Electron. Mater. Lett., vol. 10, No. 1, pp. 259-262 (2014).

M. Nasiri, S.M. Rozati, *Muscovite mica as a flexible substrate for transparent conductive AZO thin films deposited by spray pyrolysis*, Materials Science in Semiconductor Processing, vol. 81, pp. 38-43 (2018).

A. Illiberi, R. Scherpenborg, Y. Wu, F. Roozeboom, P. Poodt, *Spatial Atmospheric Atomic Layer Deposition of $Al_xZn_{1-x}O$*, Applied Materials & Interfaces, vol. 5, pp. 13124-13128 (2013).

T. Dhakal, A.S. Nandur, R. Christian, P. Vasekar, S. Desu, C. Westgate, D.I. Koukis, D.J. Arenas, D.B. Tanner, *Transmittance from visible to mid-infrared in AZO films grown by atomic layer deposition system*, Solar Energy, vol. 86, pp. 1306-1312 (Feb. 11, 2012).

A. Anders, J. Brown, A Plasma Lens for Magnetron Sputtering, IEEE Transactions on Plasma Science, vol. 39, No. 11, pp. 2528-2529 (Nov. 2011).

B. Chapman, *Glow Discharge Processes: Sputtering and Plasma Etching*, John Wiley & Sons Inc, New York, New York, (Excerpt, pp. 49-76), 1980.

* cited by examiner ns and low surface homogeneity is the electronegativity of
MAGNETRON PLASMA SPUTTERING ARRANGEMENT This application is a National Stage application of International Application No. PCT/EP2020/076047, filed Sep. 17, 2020, the entire contents of which are incorporated herein by reference.

This application claims priority under 35 U.S.C. § 119 (a) to Danish Patent Application No. PA 201970572, filed on Sep. 18, 2019, the entire contents of each of which are incorporated herein by reference.

BACKGROUND OF THE INVENTION

Technical Field

Within the field of transparent conductive oxide thin films for optoelectronic, and renewable energy, purposes there is detailed a magnetron plasma sputtering arrangement for improving e.g. optoelectronic properties of transparent conductive oxide thin films by regulation of negative ion oxygen influx to the formed thin films during magnetron plasma sputtering.

DESCRIPTION OF THE RELATED ART

Transparent and conductive (metal) oxides (TCO) are important for a large number of applications including, but not limited to, touch screens, solar cells, smart windows and light emitting diodes. Such transparent and conductive metal oxides doped with one or more, further metals are successfully used nowadays, with indium tin oxide (ITO) as the currently best material with a low resistivity around $10^{-4}$ Ωcm and transmittance above 88% in the visible spectrum. Fields of ITO-usage today in particular include touch screens for smartphones and tabletops, a field of usage predicted to increase significantly with the increased spread of telecommunication devices and the growing world population. In such fields, low resistivity provides increased sensitivity for touch screens and high transmittance provides energy savings.

However, the high demand for large area applications, coupled with the reduced abundance of indium, predicts an indium shortage in one or two decades. This motivation sustains an intensive research on alternative materials, with aluminum-doped zinc oxide, so-called AZO's, as one of the most promising choices, both in terms of low resistivity and high transmittance.

In the art of plasma discharge processing[11], several methods (cf. e.g. WO 2014/142737 or EP 2197043 A1) are used for depositing TCO's, including methods for depositing ITO's and AZO's, including physical vapor deposition [1-5,10], chemical vapor deposition[6-9] and other chemical methods such as spin coating and sol-gel. Among physical vapor deposition methods, magnetron plasma sputtering is successfully used to deposit ITO on large area substrates (up to 15 m$^2$), while also being instigated as viable cost effect solution for AZO-deposition. However, the currently achievable average resistivity of AZO thin films is more than 10 times higher than for ITO, although local values for limited AZO-areas on a given substrate may be closer to that of ITO. Such local regions on a sputtered AZO substrate having lower than substrate average resistivity has been found to correlate with uneven sputtering from the target material, typically due to racetrack formation in the target[2].

A particular advantage of magnetron sputtering is that it can easily be scaled to large areas and yields compact thin layer films with good homogeneity and quality even at low deposition temperatures[1-5].

The main reason for the reduced optoelectronic properties and the low surface homogeneity is the electronegativity of oxygen, which causes the formation of negative oxygen ions by attaching low energy electrons from plasma. Since in magnetron sputtering, the sputtering target is negatively biased (positive ions are producing the sputtering after been accelerated in a thin space charge layer named plasma sheath) the negative ions of oxygen are accelerated towards the substrate. This leads to a film growth assisted by negative ions with energies ranging from 0 to 500 eV for operation in DC and 0-300 eV for operation in radio-frequency discharge. Since the magnetron sputtering-cathode is having a set of permanent magnets behind the target, as to produce a high-density plasma close to the surface, the target erosion is not uniform. This non-uniformity is correlated with negative ion radial distribution,[2] and is mirrored on the substrate by regions of low or high resistivity. In this context, a possible solution is to develop a sputtering process where the negative ion energy can be reduced while keeping the process simple in design.

In the art, the problem of reducing the negative impact that high-energy negative ions accelerated across the plasma has on the thin films formed on the substrate has received significant attention.

In WO 2014/142737 to Helmerson, there is detailed an arrangement for, and a method of, depositing a thin film onto a substrate using high power pulsed magnetron sputtering (HiPIMS) disclosing a first magnet assembly for providing a first magnetic field in a magnetron configuration at a surface of a target trapping electrons in a first magnetic field, resulting in a confinement of the plasma close to the target surface; and a guide provided between the target and the substrate, providing a second magnetic field which guides the plasma towards the substrate surface, wherein all surface normals of an active surface portion of the target are directed such that negative ions travelling along such surface normals are prevented from reaching the substrate surface.

In EP 1172838, there is disclosed a magnetron sputter reactor and its method of operation; which produces a high fraction of sputtered metal ions and in which the metal ions are confined by a positively biased shield and attracted to a negatively biased pedestal electrode supporting the wafer to be sputter coated. The shield may be positively biased to between 10 and 50 VDC, preferably between 15 and 40 VDC while the negative self-bias on the pedestal is typically tens of volts. A grounded shield is positioned between the target and the biased shield.

Tiron et al.[4] detail a method used to control Al-doping of ZnO thin films deposited by high-power impulse magnetron sputtering of a pure Zn target in low-pressure Ar/O2 gas mixture. The method uses sputtering of an electrically negative biased aluminum electrode placed in the proximity of the negative glow of the magnetron discharge. Resonant laser absorption measurements of Al atom-concentration in vapor phase and the X-ray Photoelectron Emission Spectroscopy measurements of Al-concentration in the deposited ZnO:Al films confirm that the electrode biasing potential is the key parameter that controls the Al-doping process. Optically transparent ZnO:Al films with resistivity as low as $3.6 \times 10^{-3}$ Ωcm have been obtained at an optimum value of Al-concentration of 1.5 atomic %. It was found that the film electrical conductivity is limited by the effect of decreasing of crystalline grain size in the films with the increased Al-doping concentration.

In Tiron et al.[4], it is the intention of the authors to erode and release aluminum from the biasing electrodes.

Therefore the biasing is significantly stronger compared to the biasing used in the present invention, i.e. in excess of the release energies for Al from the electrode, wherein biasing in the present method and invention is sufficiently low for negligible release of material, i.e. essentially below the release energies for the metal(s) constituting the tuning electrode (40).

However, there remains a need for systems and methods of depositing TCO's, in particular AZO and ITO, using magnetron sputtering for mass production and large surfaces, which is simple to implement yet resulting in optimal optoelectronic properties and homogenous surfaces.

The present invention describes in an aspect a magnetron plasma sputtering arrangement and in a further aspect a method for improving optoelectronic properties of transparent conductive oxide thin films according to which, the negative ion energy can be reduced to below 100 eV and consequently reduce the AZO thin film resistivity about two times. The main element is an additional electrode (named tuning electrode) placed in the plasma field between the cathode and the substrate, with the role of increasing the coupling of the electromagnetic power and consequently reduce the potential drop over the space charge layer in front of the cathode, with immediate impact on the negative ion energy.

SUMMARY OF THE INVENTION

The present disclosure and invention concerns in an aspect a magnetron plasma sputtering arrangement (3,4) including an evacuable chamber (10) operatively coupled to a pumping system (13) for generating a vacuum and means for pressure (14) and gas flow control (15); where, in the evacuable chamber (10), is arranged a sputtering head (20) including a grounded anode (21), and a sputtering cathode (25) including a sputtering target (22) and magnets (24a-c) for enhancing a plasma produced at the sputtering target (22), the sputtering target (22) operatively connected to an RF power supply (11) for, in use, producing a plasma at the sputtering target (22) and releasing plasma sputtered material from a sputtering target surface (23); a substrate holder (30) for a substrate (31) for receiving plasma sputtered material on a surface (32) of the substrate (31), thereby forming a thin film of plasma sputtered material on the surface (32) of the substrate (31); and wherein a tuning electrode (40), operatively connected to a biasing source (42) with respect to ground (12c), and including an aperture (41) defining at least one axis of length (Φ), is arranged in a flow path for plasma between the sputtering cathode (25) and the substrate (31), such that a plasma sputtered material originating at the sputtering target (22) will traverse the aperture (41) before depositing onto the surface (32) of the substrate (31) as a thin film.

DETAILED DESCRIPTION

Figure 1:
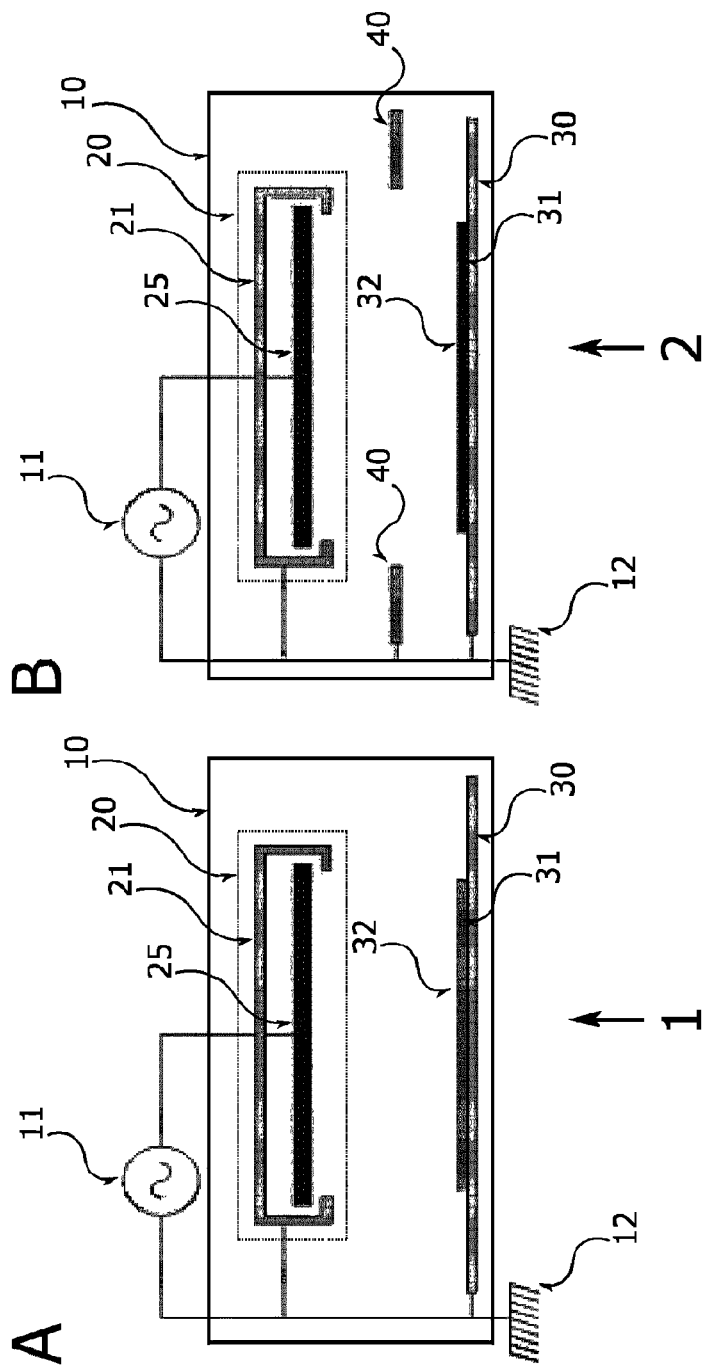
FIG. 1: Shows a schematic of a conventional magnetron plasma sputtering arrangements without (A) and with (B) tuning electrode.

As discussed, it is an object of the present disclosure to present an arrangement for magnetron plasma sputtering deposition of a thin film onto a substrate surface, in particular to present such an arrangement, wherein detrimental effects on the growing film of negatively charged ions produced in the magnetron plasma sputtering plasma process are either eliminated or reduced. Further, it is an object of the present invention to present an arrangement for, and methods of, plasma deposition of thin films on substrate surfaces, which have improved optoelectric properties.

The present disclosure details a magnetron plasma sputtering arrangement (3,4) including an evacuable chamber (10); where, in the evacuable chamber (10), a tuning electrode (40), operatively connected to a biasing source (42) with respect to ground (12c), and including an aperture (41) defining at least one axis of length (Φ), is arranged in a flow path for plasma between a sputtering head (20) and a substrate (31), such that a plasma sputtered material originating at a sputtering target (22) will traverse the aperture (41) before depositing onto the surface (32) of the substrate (31) as a thin film.

In FIG. 1 there are detailed magnetron plasma sputtering arrangements (1,2) of the prior art; the arrangements (1,2) including an evacuable chamber (10) wherein is arranged a sputtering head (20) comprising a grounded anode (21) and a sputtering cathode (25) including a sputtering target (22) for releasing a sputtered material in a plasma, the sputtering target (22) operatively connected to an RF power supply (11) for, in use, producing a plasma at the sputtering target (22); and a substrate holder (30) including a substrate (31) for receiving the sputtered material on a surface (32) of the substrate (31), thereby forming a thin film of the sputtered material on the surface (32) of the substrate (31). In the shown arrangements (1,2), the RF power supply (11), the sputtering head (20), and the substrate (31), are operatively coupled to a common ground (12). The embodiments (1,2) are shown respectively without (FIG. 1A), and with (FIG.

1B), a tuning electrode (40) arranged in the evacuable chamber (10) between the sputtering head (20) and the substrate holder (30) including the substrate (31). The shown embodiment (2) including the tuning electrode (40) shares the common ground (12) with the sputtering head (20) and the substrate holder (30).

Figure 2:
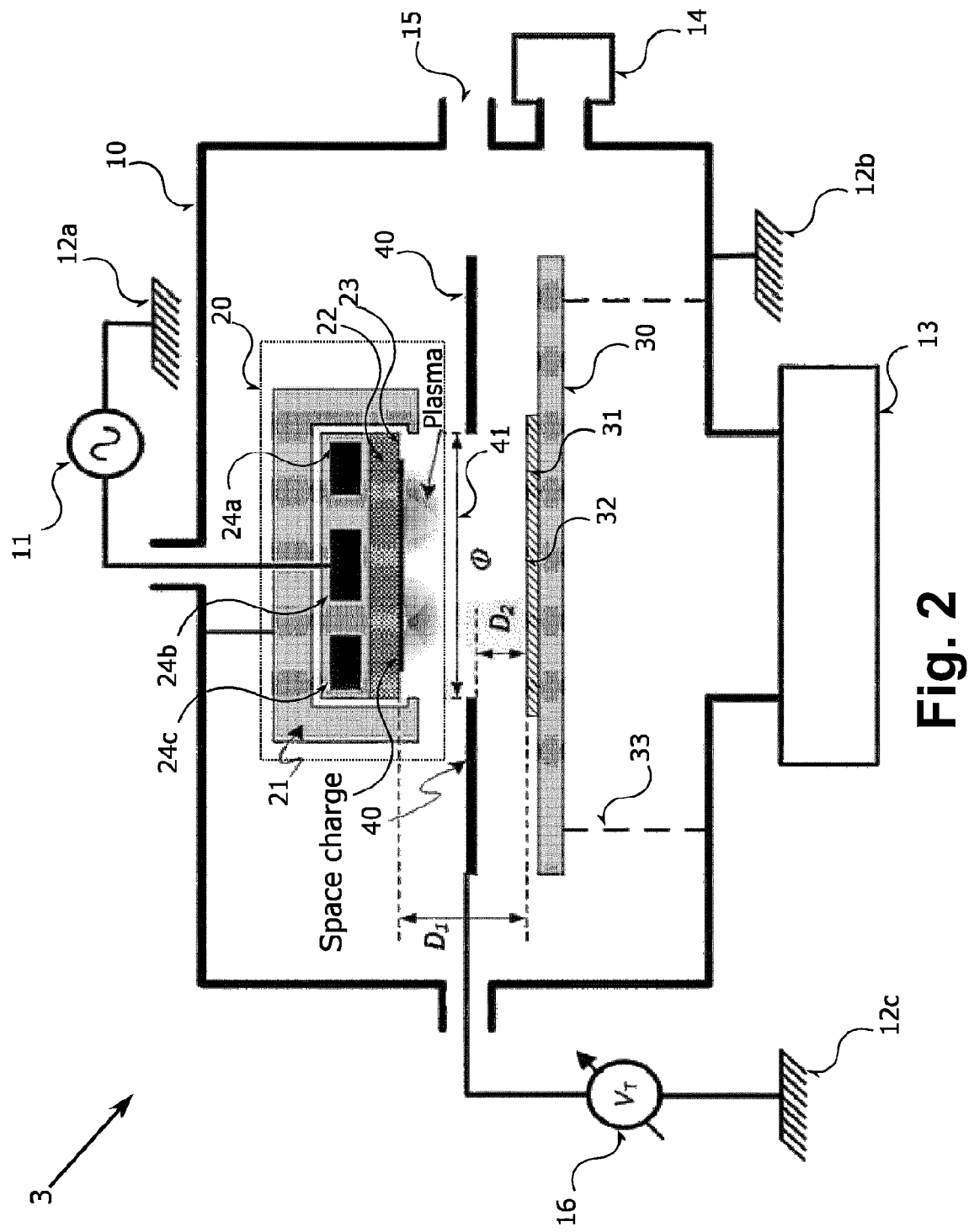
FIG. 2: Shows a schematic of an embodiment of a magnetron plasma sputtering arrangement of the invention including a head.

In FIG. 2 there is detailed a magnetron plasma sputtering arrangement (3) of the present invention.

In accordance with the present invention there is disclosed herein: A magnetron plasma sputtering arrangement (3) including an evacuable chamber (10) operatively coupled to a pumping system (13) for generating a vacuum and means for pressure (14) and gas flow control (15); where, in the evacuable chamber (10), is arranged a sputtering head (20) including a grounded anode (21), and a sputtering cathode (25) including a sputtering target (22) and magnets (24*a-c*) for enhancing a plasma produced at the sputtering target (22), the sputtering target (22) operatively connected to an RF power supply (11) for, in use, producing a plasma at the sputtering target (22) and releasing plasma sputtered material from a sputtering target surface (23); a substrate holder (30) for a substrate (31) for receiving plasma sputtered material on a surface (32) of the substrate (31), thereby forming a thin film of plasma sputtered material on the surface (32) of the substrate (31); and wherein a tuning electrode (40), operatively connected to a biasing source (16) with respect to ground (12*c*), and including an aperture (41) defining at least one axis of length (Φ), is arranged in a flow path for plasma between the sputtering cathode (25) and the substrate (31), such that a plasma sputtered material originating at the sputtering target (22) will traverse the aperture (41) before depositing onto the surface (32) of the substrate (31) as a thin film.

As is known in the art, the tuning electrode bias, $V_T$, received at the tuning electrode (40) from the biasing source (16) can be DC, AC or pulsed.

As shown in FIG. 2 and as is customary in the art, the RF power supply (11) in some embodiments includes a voltage probe for measuring the DC self-bias and a matching box for reducing the reflected power. Advantageously, the frequency can be adjusted from KHz up to hundreds of MHz, including pulse modulation. As is known in the art, inclusion of a matching box into the RF power supply (11) (whether capacitive and/or inductive) will serve to minimize the reflected power, which is preferable for full achievement of the improvements in AZO-thin films reported herein.

In general, however, it is considered in the context of the present invention, that the skilled person will know how to select an RF power supply (11) in accordance with the specific needs of a given arrangement (3) implementing the present invention.

As shown in FIG. 2 and as customary in the art, magnets (24*a-c*) for enhancing the plasma density produced at the anode (21) are arranged in the sputtering head (20). In the experimental setup used for providing the present results, magnets (24*a-c*) placed behind the sputtering target (22) provided 900 Gauss at the center of the sputtering target (22) at the sputtering target's surface level (23), and this value decreased below 100 Gauss at distances larger than 30 mm from the sputtering target's center. In general, it is considered that the skilled person knows how to select and employ magnets for enhancing the plasma density, and accordingly this aspect is considered to be outside of the present invention.

In one embodiment, c.f. FIG. 2, the magnetron plasma sputtering arrangement (3) further includes a repositioner or repositioning means (33) arranged within the evacuable chamber (10), such that the tuning electrode (40) can be repositioned with respect to the sputtering target (22) and the substrate (31) by controlling at least one of a first distance D1 between the sputtering target (22) and the substrate (31) and a second distance D2 between the tuning electrode (40) and the substrate (31).

In one embodiment, the repositioner (33) is operatively connected to any of the elements (20,30,40), including the sputtering head (20), the substrate holder (30) or the tuning electrode (40). When the repositioner (33) is operatively connected to either of the sputtering head (20) or the substrate holder (30), the repositioner (33*a*,33*c*) influences respectively D1 or D2, while the other distance remains constant, whereas when the repositioner (33*b*) is operatively connected to the tuning electrode (40), the repositioner influences both D1 and D2.

Figure 3:
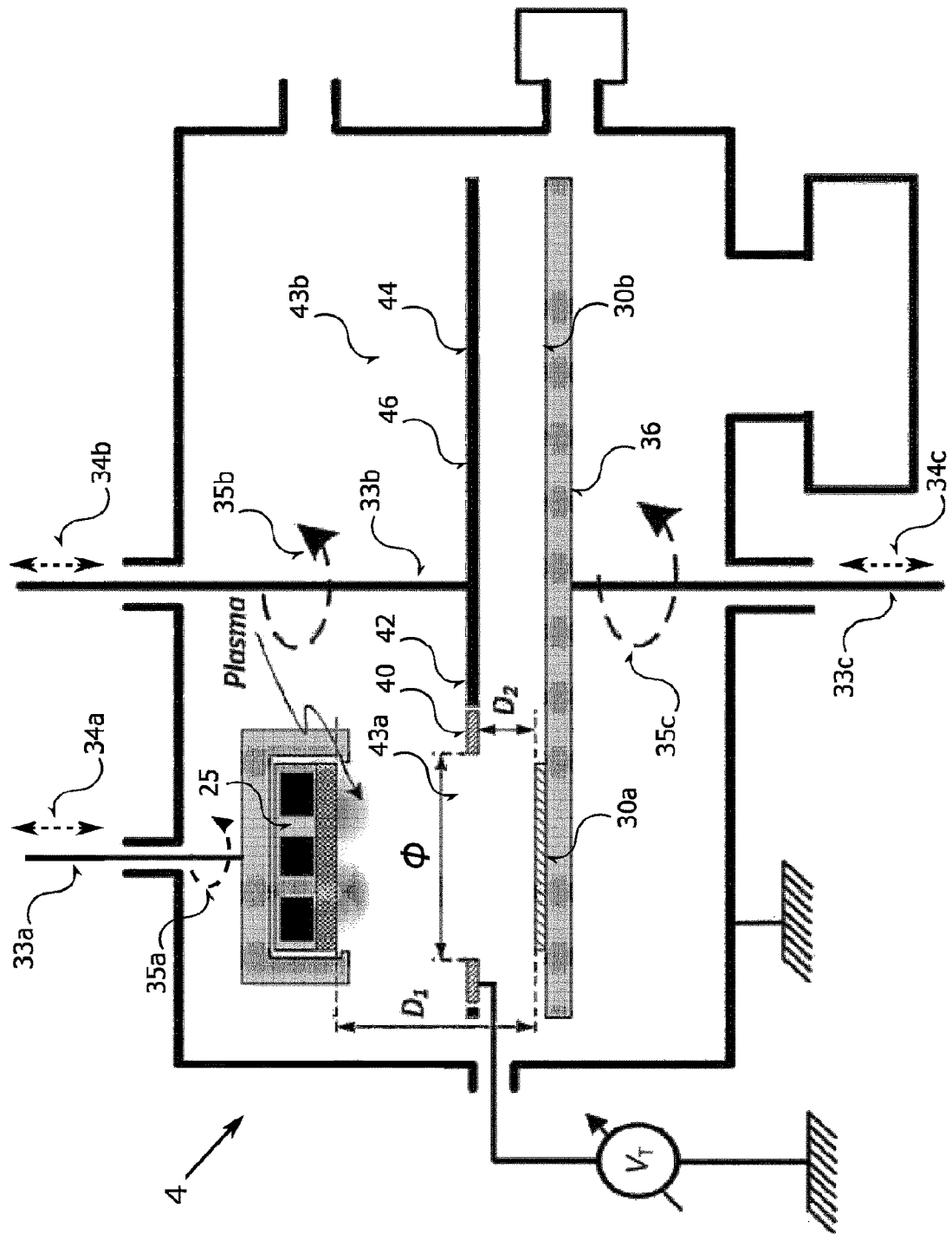
FIG. 3: Shows a schematic of an embodiment of a magnetron plasma sputtering arrangement of the invention including a repositioner or repositioning means.

In an embodiment, c.f. FIG. 3, the repositioner (33) is an elongated member (34*a-c*) such as e.g. a rod or a stick or like.

In an embodiment, the sputtering head (20) is operatively connected to a first repositioner (33*a*) including either a first axis of displacement (34*a*), a first axis of rotation (35*a*), or both a first axis of displacement (34*a*) and a first axis of rotation (35*a*). Preferably, the respective first axes (34*a*,35*a*) are one axis.

In an embodiment, the tuning electrode (40) is operatively connected to a second repositioner (33*b*) including either a second axis of displacement (34*b*), a second axis of rotation (35*b*), or both a second axis of displacement (34*b*) and a second axis of rotation (35*b*). Preferably, the respective second axes (34*b*,35*b*) are one axis.

In an embodiment, the substrate holder (30) is operatively connected to a third repositioner (33*c*) including either a third axis of displacement (34*c*), a third axis of rotation (35*c*), or both a third axis of displacement (34*c*) and a third axis of rotation (35*c*). Preferably, the respective third axes (34*c*,35*c*) are one axis.

In an embodiment, c.f. FIG. 3, a respective repositioner (33*a-c*) includes a respective axis of displacement (34*a-c*) with respect to D1 and/or D2. When at least two respective axes of displacement (34*a-c*) are present, these are arranged for parallel displacement.

In a further embodiment, c.f. FIG. 3, a respective repositioner (33*a-c*) includes a respective axis of rotation (35*a-c*). When at least two respective axes of rotation (35*a-c*) are present, these are arranged to rotate in parallel.

In a further embodiment, c.f. FIG. 3, a respective repositioner (33*a-c*) includes both a respective axis of displacement (34*a-c*) with respect to D1 and/or D2, and a respective axis of rotation (35*a-c*).

In one embodiment, c.f. FIG. 3, the magnetron plasma sputtering arrangement (3,4) further includes an aperture resizer or resizing-means (42) arranged within the evacuable chamber (10) for resizing the at least one axis of length (Φ) of the aperture. In an embodiment thereof, the aperture resizer (42) is a diaphragm, preferably an iris diaphragm.

In one embodiment, c.f. FIG. 3, the magnetron plasma sputtering arrangement (3,4) includes both a repositioner (33) and an aperture resizer (42) arranged within the evacuable chamber (10).

Figure 4:
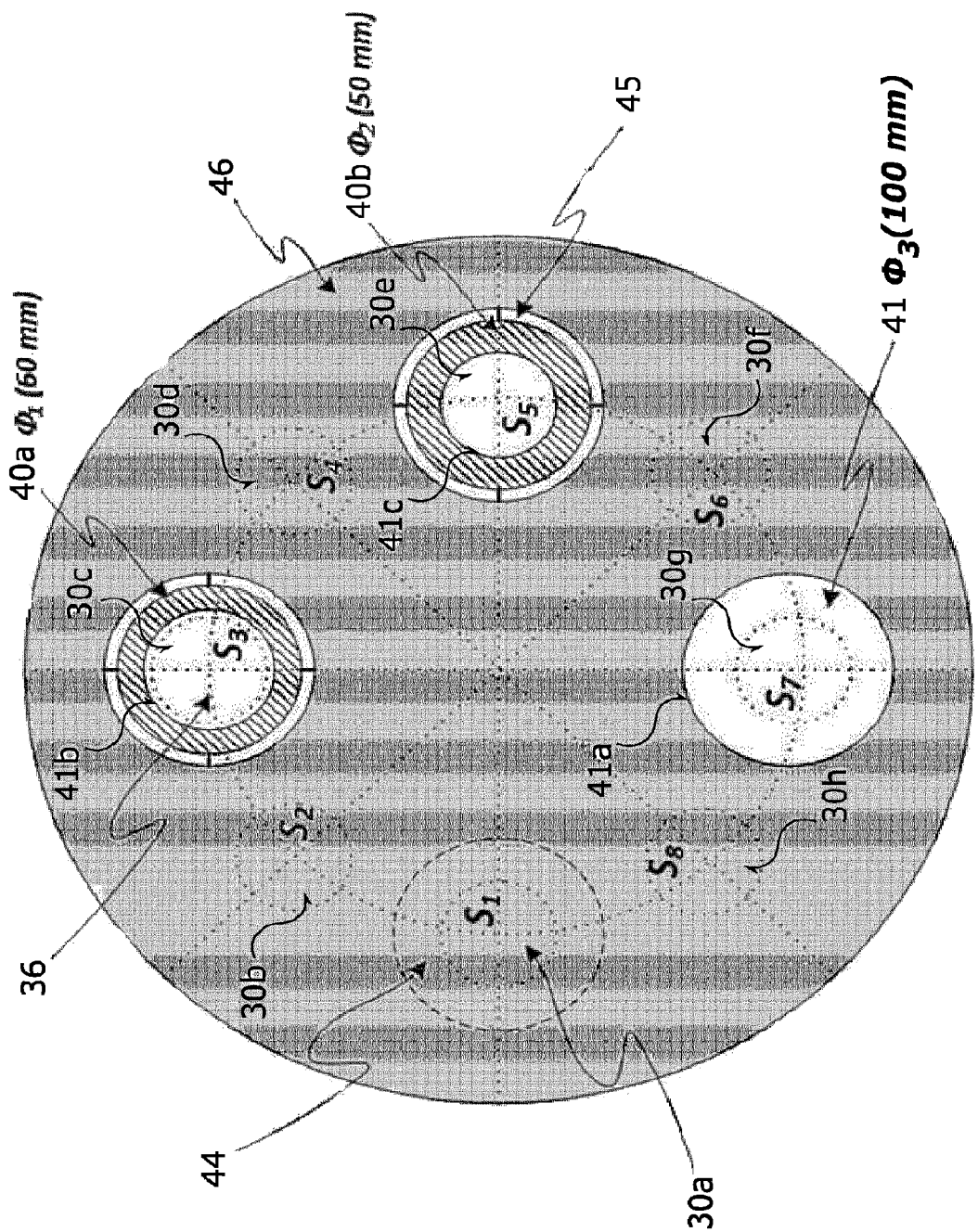
FIG. 4: Shows a schematic of an embodiment of a magnetron plasma sputtering

In an embodiment, the tuning electrode (40) is arranged on a first rotatable element (46) operatively connected to the second repositioning means (33*b*). FIG. 3 shows an embodiment thereof, wherein the first rotatable element (46) is a plate or a disk for rotating between a position in the flow of plasma-sputtered material (43*a*) and a position outside the flow of plasma-sputtered material (43*b*). FIG. 4 shows an embodiment thereof, wherein at least two tuning electrodes (40a,40b) are arranged on the first rotatable element (46), in the shown embodiment a plate or a disk, for rotating between a position in the flow of plasma-sputtered material (43a) and a position outside the flow of plasma-sputtered material (43b). When, as shown in FIG. 4, apertures (41a-c) of different sizes are arranged in the first rotatable element (46), this element when being rotated also comprises the aperture resizing-means (42).

In an embodiment, the substrate holder (30) is arranged on a second rotatable element (36) operatively connected to the third repositioning means (33c). FIG. 3 shows an embodiment thereof, wherein the second rotatable element (36) is a plate or a disk for rotating between a position in the flow of plasma-sputtered material (43a) and a position outside the flow of plasma-sputtered material (43b). FIG. 4 shows an embodiment thereof, wherein at least two tuning electrodes (40a,40b) are arranged on the rotatable element (46), in the shown embodiment a plate or a disk, for rotating between a position in the flow of plasma-sputtered material (43a) and a position outside the flow of plasma-sputtered material (43b).

As shown in FIGS. 3 and 4, more than one substrate holder (30a -h) may be arranged on the second rotatable element (36). By arranging more than one substrate holder (30a -h) for displacement (here by rotation) between a position in the flow of plasma-sputtered material (43a) and a position outside the flow of plasma-sputtered material (43b), several substrates can be coated under same conditions without inhomogeneities due to start-up/shut-down of the plasma as discussed below in relation to the magnetron plasma sputtering arrangement (3,4) comprising a shutter (44).

In FIG. 3 a versatile embodiment (4) and configuration of the present magnetron plasma sputtering arrangement (3) is shown, wherein, rather than one, at least two elements of either the sputtering head (20), the substrate holder (30) and/or the tuning electrode (40) are arranged on respective repositioning means (33a-c) for independent repositioning of a respective element (20,30,40) with respect to D1 and/or D2. In principle, it is not necessary to adjust the relative position of more than two of the respective elements (20, 30,40) for optimizing D1 and D2, however in some systems, free positioning of all three respective elements (20,30,40) can be advantageous.

In one embodiment, the magnetron plasma sputtering arrangement (3,4) includes a shutter (44) arranged for closing the flow of plasma-sputtered material from the sputtering target (22) to the substrate (31). Provision of a shutter (44), as is known to the skilled person, is advantageous as sputtering-inhomogeneities from plasma on/off processes can be kept from contaminating the substrate to be sputtered, respectively having been sputtered, when the sputter (44) is in position and is closed. In some embodiments, when the aperture resizer (42) is an iris diaphragm, the diaphragm also can serve as a shutter (44) when fully closed.

In one embodiment of the magnetron plasma sputtering arrangement (3,4), c.f. FIGS. 3 and 4, the first rotatable element (43) includes a section without an aperture (41), which can serve as a shutter (44). Thereby the flow of plasma-induced material from the sputtering target (22) to the substrate (31) can be interrupted in a simple manner, by rotating the shutter section (44) into the flow of plasma-induced material, without the need to turn the plasma-generation off.

In a preferred embodiment of the tuning electrode (40), the aperture's (41) size and the at least one axis of length ($\Phi$) of the aperture is matched to the size of substrate surface (32), such that a cross-sectional area defined by the aperture (41) is not larger than a cross-sectional area defined by the aforementioned substrate surface (32) by more than 50%. In some embodiments, the aperture's (41) size is identical to the defined cross-sectional area of the substrate surface (32), or in further embodiments, the aperture's (41) size is smaller than the defined cross-sectional area of the substrate surface (32).

In a preferred embodiment of the tuning electrode (40), the aperture's (41) size and the at least one axis of length ($\Phi$) of the aperture is matched to the size of sputtering target (22), such that a cross-sectional area defined by the aperture (41) is not larger than a cross-sectional area defined by the aforementioned sputtering target (22) by more than 50%. In some embodiments, the aperture's (41) size is identical to the defined cross-sectional area of the sputtering target (22), or in further embodiments, the aperture's (41) size is smaller than the defined cross-sectional area of the sputtering target (22).

FIG. 4 exemplifies a situation wherein the substrate surface (32) is circular with a diameter of 50 mm and the aperture's (41) shape is circular with a diameter ($\Phi$) of respectively 100 mm (41a), 60 mm (41b) and 50 mm (41c). As will be detailed in the examples, for the experimental setup used to exemplify the present invention, a 100 mm aperture size (41a) is tantamount to a fully open aperture, which does not influence the flow of plasma, 60 mm (41b) is of a size sufficient to influence the flow of plasma, and 50 mm (41c) corresponds to the situation of 1:1 between aperture size and substrate surface size.

The magnetron plasma sputtering arrangement (3,4) setup exemplified in FIGS. 3 and 4 details a situation wherein the respective second repositioner (33a) operatively connected to the tuning electrode (40) includes the aforementioned second axis of displacement (34a) and the respective third repositioner (33c) operatively connected to the substrate holder (30) includes comprises the aforementioned third axis of displacement (34c) and wherein the respective second and third axes of displacement (34b,34c) are aligned substantially coaxially. Embodiments of the magnetron plasma sputtering arrangement (3,4), wherein the respective second and third axes of displacement (34b,34c) are aligned substantially coaxially are particularly preferred embodiments of the present magnetron plasma sputtering arrangement (3,4).

In the exemplified embodiments of the magnetron plasma sputtering arrangement (3,4), c.f. FIGS. 3 and 4, the tuning electrode (40) and the substrate holder (30) are arranged on respective first and second rotatable elements (36,46) and at least one of the two respective repositioners (33b,33c) also includes a respective axis of rotation (35b,35c). When, in accordance with the particularly preferred embodiments of the present magnetron plasma sputtering arrangement (3,4), the respective second and third axes of displacement (34b, 34c) are substantially coaxially aligned, it is possible to rotate elements, such as shutters (44), aperture resizer (42), or one or more substrate holders (30a-h), of the magnetron plasma sputtering arrangement (3,4) arranged on the respective first and second rotatable elements (36,46) from a position in the flow of plasma (43a) to a position outside the flow of plasma (43b) with good precision and coordination of the repositioners (33b,33c).

In order to minimize secondary sputtering and contamination by the aperture (41), the tuning electrode (40) is preferably made from one or more materials with limited possibilities for contaminating the plasma sputtered material, preferably from a material in accordance with the composition of the sputtering target. E.g., when the sputtering target is an AZO-ceramics, the tuning electrode (40) preferably is made from aluminum and/or zinc, and preferably aluminum and zinc in an alloy having a ratio of Al:Zn in accordance with the sputtering target composition. The exact tuning electrode Al:Zn ratio, when used in accordance with the sputtering target composition, is not likely to be identical to the sputtering target composition due to differences in release energy for different atoms from a tuning electrode alloy, but such energies are known or can be measured, and hence the atom release from the tuning electrode can be made to match the atomic composition in the plasma in accordance with the knowledge in the art for minimal contamination. Likewise, the tuning electrode can be used for controlled atomic doping with trace elements if such elements are included into the tuning electrode.

In an advantageous embodiment of the magnetron plasma sputtering arrangement (3,4), the tuning electrode (40) is isolated electrically from the first rotatable element (46), c.f. FIG. 4. This can be done e.g. by providing a non-conducting material (45), such as vacuum in the form of an insulation gap, between the tuning electrode (40) or the first rotatable element (46), as indicated in FIG. 4.

While in general the geometry of the sputtering head (20) is of lesser importance, in some embodiments the sputtering head (20) can be either circular or rectangular.

In some embodiments of the magnetron plasma sputtering arrangement (3,4), the substrate holder (30) is grounded, preferably sharing a common ground (12a-c) with at least one of the sputtering head (20), the evacuable chamber (10), or the tuning electrode (40).

In other embodiments of the magnetron plasma sputtering arrangement (3,4), the substrate holder (30) includes heating means. Thereby it is possible to anneal the formed surfaces during deposition or shortly after and without removing the coated substrates from the vacuum. This beneficially improves the optoelectronic properties of the formed coatings and thin films.

In some embodiments, the rotational means (35a-c) can be combined or augmented with translational means (not shown in the figures) for overcoming inhomogeneities of deposition. E.g. such inhomogeneity can easily be overcome by rotating the samples (31) or sputtering target (22) during depositing, such as by using rotating means (35a,35c) arranged with the sample holder (30) or the sputtering head (20). Preferably, however, a translational component is also included into the movement of sample (31) respectively sputtering target (22) for improving the homogeneity of the deposited sample layer. Separate translation means (not shown in the figures) should then be arranged on either the sample holder (30) or the sputtering head (20). Alternatively, the rotation and translation means could be combined such as in providing e.g. eccentric or elliptical rotation of sample holder (30) or sputtering head (20).

Figure 5:
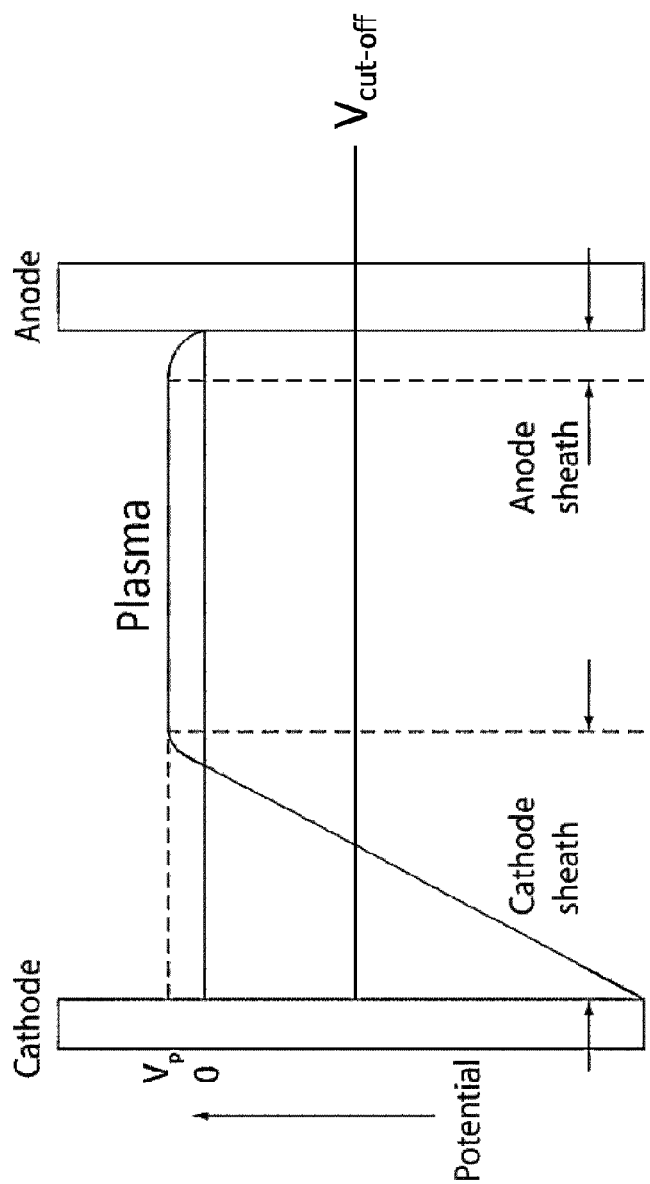
FIG. 5: Schematically shows a plasma potential distribution.

The schematic shown in FIG. 5 relates the present invention and the associated method of depositing a thin film by plasma sputtering to the prior art detailed in WO 2014/142737 to Helmerson. The method and system detailed in Helmerson essentially provides a hard cut-off for high-energy negative ions, such that these high-energy negative ions are prevented from reaching the substrate. This is schematically indicated in FIG. 5 by a line indication a corresponding $V_{cut-off}$, where negative ions having energies below the cut-off energies, but originally released to the plasma at the cathode, are removed from the matter flux.

The present inventor considers, without being bound by these considerations, that the tuning electrode bias, $V_T$, influences the average energy of the negative ions in the plasma rather that the total energy spread, a sequence of tuning electrodes (40) or a funnel of tuning electrodes (40) for narrowing the total energy spread of the negative ions present in the depositing plasma may advantageously be applied in lieu of a single tuning electrode (40) having a single tuning electrode bias, $V_T$. Thereby a better correspondence to the optimal plasma potential, $V_P$, for all negative ions can be obtained.

The advantages of providing a tuning electrode bias, $V_T$, in accordance with the present invention are detailed and documented in the experiments and examples, and in the corresponding figures.

EXAMPLES

Experimental:

FIGS. 3 and 4 details the actual magnetron plasma sputtering arrangement (3,4) used to obtain the presented results, wherein FIG. 4 details the first rotatable element (46) in the form of a rotatable shutter plate (46). The shutter plate (46) could be translated (vertically in the present setup) to adjust D2 and included a shutter section (44), two tuning electrodes (40a,40b). Below the shutter plate (46), a second rotatable element (36), in the form of a rotatable sample plate (36) including 8 sample locations (30a-h) was arranged. The results reported herein were obtained in a cylindrical vacuum chamber (10) of 50 cm in diameter and 30 cm in height. The sputtering head (20) comprising a 5 cm in diameter sputtering target (22) was placed above the substrate holder (30) at an adjustable distance, D1.

Magnets (24a-c) placed behind the sputtering target (22) provided 900 Gauss at the center of the sputtering target (22) at the sputtering target's surface level (23), and this value decreased below 100 Gauss at distances larger than 30 mm from the sputtering target's center.

Two tuning electrodes (40a,40b) with 50 and 60 mm openings for deposition were mounted with small insulators (45) on the shutter plate (46), which also included a third aperture (41) of 100 mm diameter for conventional deposition (no tuning). The section of the shutter plate (46) used as a shutter (44) allowed for sputtering target (22) cleaning by pre-sputtering without risking depositing unwanted plasma-sputtered material on the sample substrates (31).

The substrate holders (30a -h) were metallic disks with the same diameter as the shutter plate (46) whereon up to 8 samples (indicated by S1 to S8) could be placed at equal angular spacing of 45°, centered to match the aperture (41) for deposition.

This configuration provided the possibility to deposit plasma-sputtered material on up to 8 consecutive substrates (31) under varying experimental conditions without breaking an established vacuum between depositions. In this respect, it is particularly important to note that depositing the samples by breaking the vacuum or using a load lock does not necessarily ensure the same deposition conditions. Hence, the ability for rotating the new samples into the flow of plasma (43a) is a particularly interesting element of the present magnetron plasma sputtering arrangement.

Experiments were performed as reported below by systematically changing one of the discharge parameters (pressure, RF power, D1, D2, tuning electrode bias $V_T$, DC self-bias, deposition time) while keeping all others constant. The process parameters for each experiment result are detailed in the present description and in the figures reporting the various experiments. The sputtering target (22) was a 50 mm in diameter Al doped ZnO target (2% Aluminum). Self-bias was measured as the potential imposed on a given tuning electrode (40) for eliminating bias at a given set of discharge parameters. RF-frequency of 13.56 MHz.

In the experiments, plasma was ignited at pressures above 10 mTorr, with the shutter (44) in place for preventing deposition of unwanted plasma-sputtered material onto the substrates (31). Only after adjustment of all discharge parameters (including where relevant the vacuum pressure) was the shutter opened.

For depositing one sample, the shutter (44) was placed in front of the sputtering head (20), the sample (31) to be deposited was centered below the sputtering head (20), whereupon the discharge parameters were adjusted, and finally the shutter (44) was opened by rotating the shutter plate (46) to a desired position of a respective tuning electrode (40a,40b) or aperture (41).

Example 1

Figure 6:
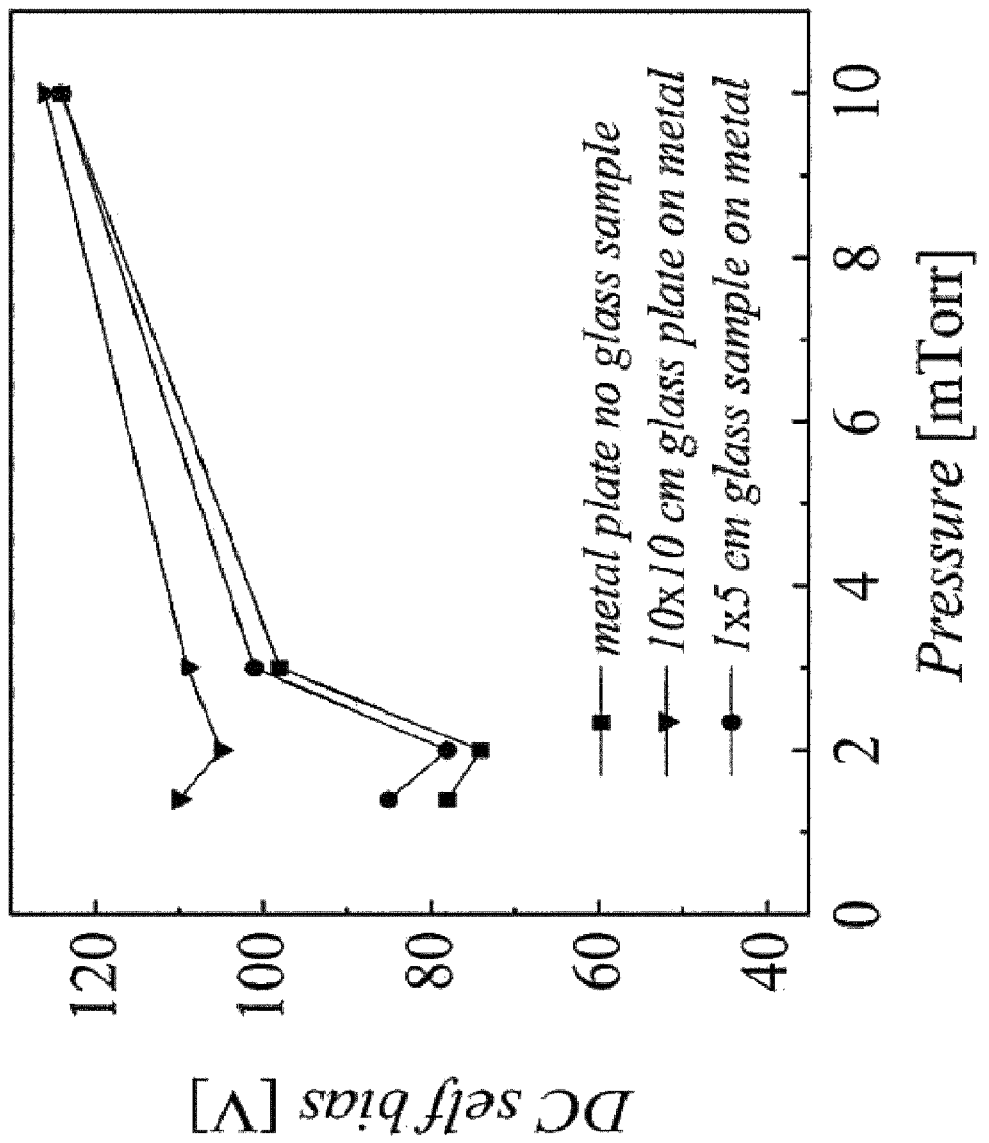
FIG. 6: Ex. 1-DC self-bias vs Vacuum-pressure graph.

In Example 1 and FIG. 6 is reported the DC self-bias as a function of pressure measured with a 50 mm in diameter Al doped ZnO target (2% Aluminum) when under 20 W power at 13.56 MHz, in a standard configuration (see FIG. 4) for three different substrates (31) in an Ar-atmosphere at varying vacuum-pressures: (■) Sputtering target (22) facing a metallic surface (metal plate no glass sample), (▼) sputtering target (22) facing an insulating surface (10×10 cm glass plate on metal) and (●) sputtering target (22) facing a metallic surface partially covered with an insulator (1×5 cm glass sample on metal). The configuration corresponds to a standard situation of no tuning electrode (cf. FIG. 1A), which in the present experiments corresponds to an aperture opening (Φ) of 100 mm, cf. FIG. 4.

The experiment reveals a strong dependency of the DC self-bias on the ability of the substrate to conduct a current, but also that in an intermediate vacuum-pressure region of 1 mTorr to 3 mTorr, notably at 2 mTorr, the DC self-bias is at a minimum for all substrates. Generally, DC self-biases of above 70 V as observed in the present experiment correlates with high-energy negative ions of above 140 eV reaching the substrate during deposition, which is above the etching threshold for the substrates as discussed above and hence negatively influences the deposited substrates.

Example 2

Figure 7:
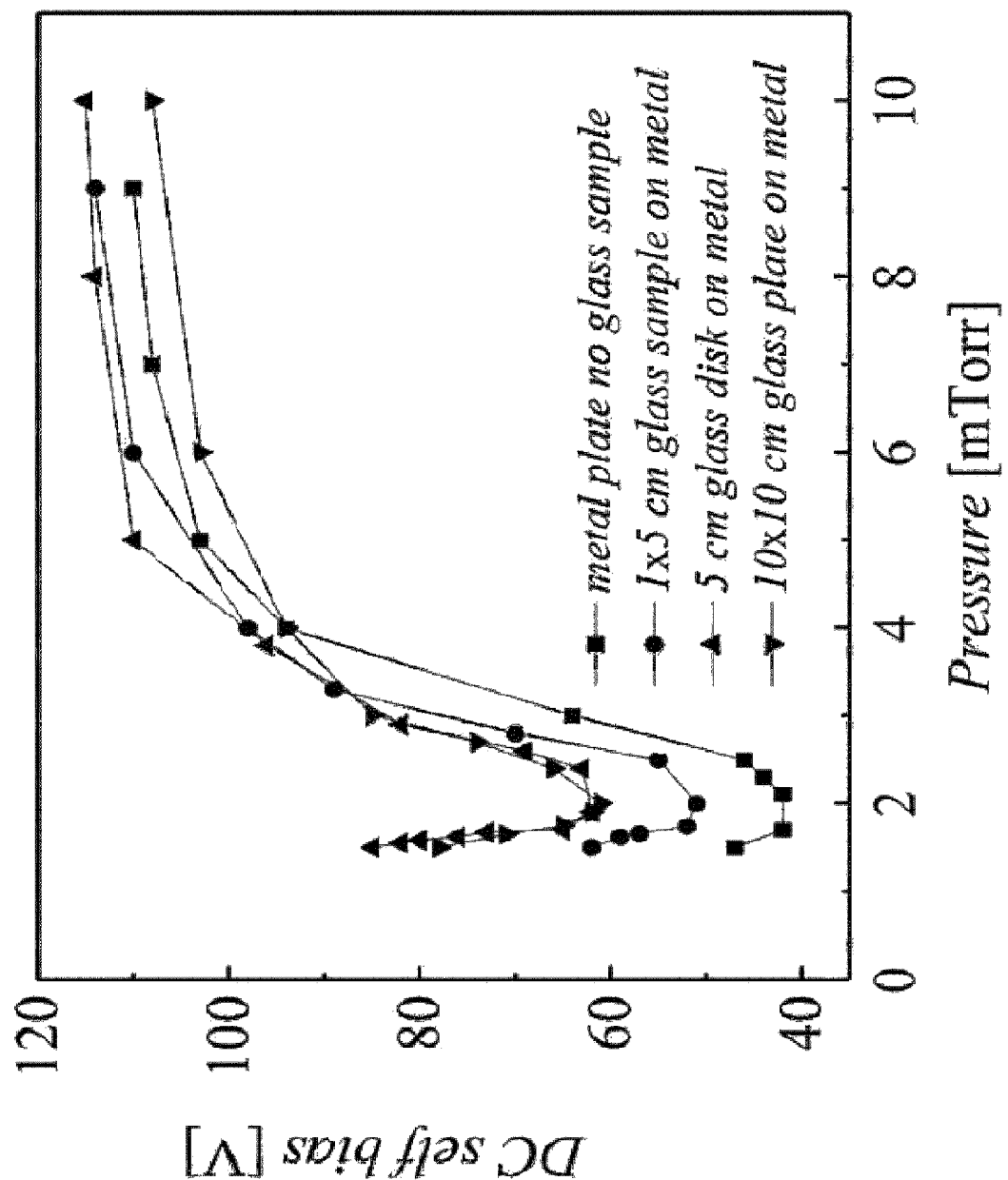
FIG. 7: Ex. 2-DC self-bias vs Vacuum-pressure graph.

In Example 2 and FIG. 7 is reported the DC self-bias as a function of pressure measured with a 50 mm in diameter Al doped ZnO target (2% Aluminum) when under 20 W power at 13.56 MHz, in a standard configuration with tuning electrode (see FIG. 4) for three different substrates (31) in an Ar-atmosphere at varying vacuum-pressures: (■) Sputtering target (22) facing a metallic surface (metal plate no glass sample), (▼) sputtering target (22) facing an insulating surface (10×10 cm glass plate on metal), (▲) sputtering target (22) facing an insulating surface (5 cm glass disc on metal), and (●) sputtering target (22) facing a metallic surface partially covered with an insulator (1×5 cm glass sample on metal). The aperture opening (Φ) was 50 mm (cf. FIG. 4).

In examples 1 and 2 (cf. FIGS. 7 and 8), both experiments showed minimum values of the DC self-bias around 2 mTorr. However, for all samples observed the DC self-bias was significantly reduced with direct consequence on the negative ion energy, e.g. for a 10×10 cm glass plate on metal a reduction from 105 V to 63 V was observed.

Example 3

Figure 8:
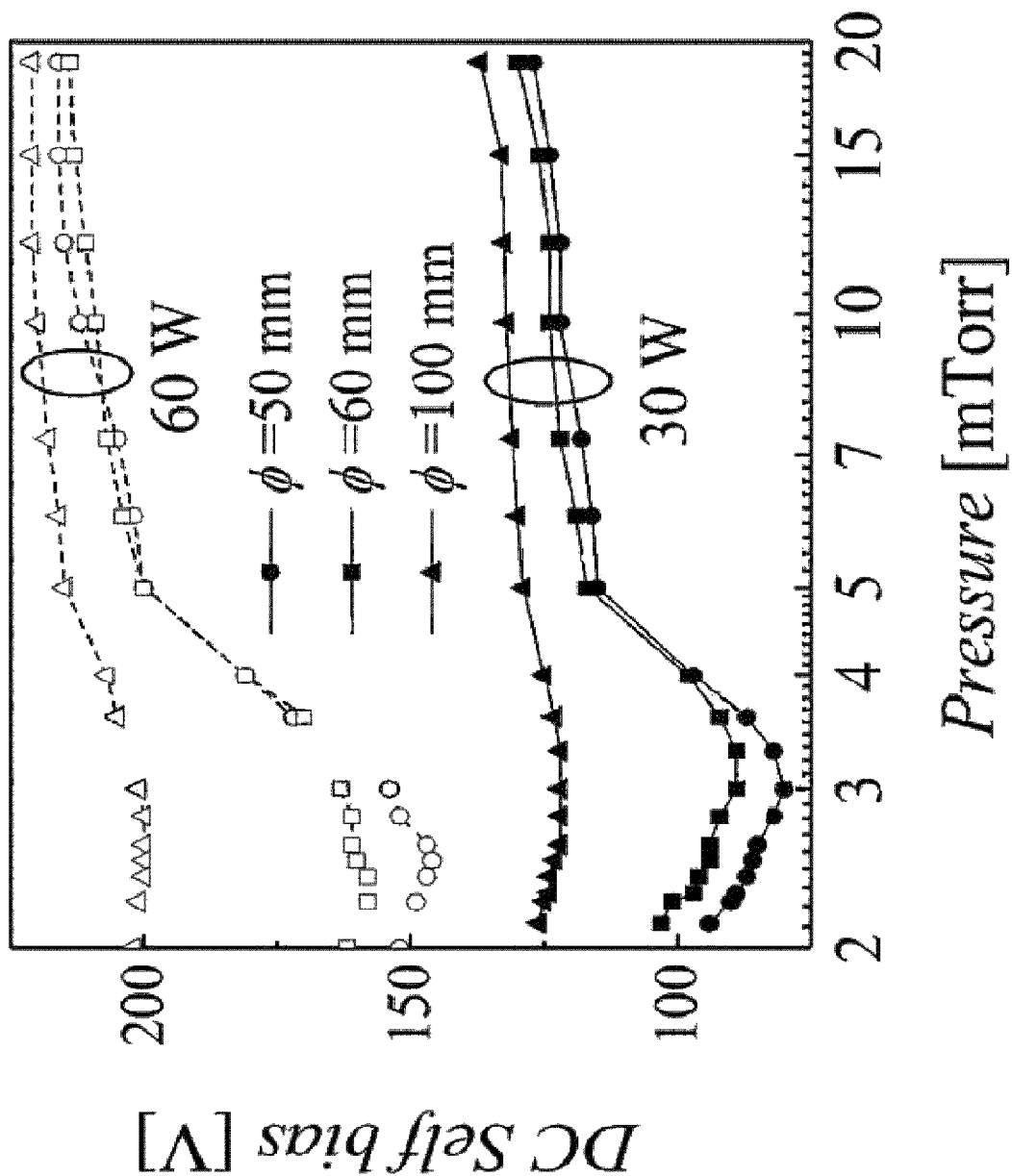
FIG. 8: Ex. 3-DC self-bias vs Vacuum-pressure graph.

In Example 3 and FIG. 8 is reported the DC self-bias as a function of pressure measured with a 50 mm in diameter Al doped ZnO target (2% Aluminum) when at 30 W (closed captions) and 60 W (open captions) power at 13.56 MHz, in a standard configuration with tuning electrode (see FIG. 4) for three different aperture (41) openings (Φ) in an Ar-atmosphere at varying vacuum-pressures: (▲) (Φ) 100 mm, (■) (Φ) 60 mm, and (●) (Φ) 50 mm.

The measurement shows a significant reduction of the DC self-bias even for (Φ) 60 mm at both power levels. As expected the reduction in self-bias is strongest (absolute) for 60 W power since at increased powers more negative ions will form. The data further confirms that when (Φ) 100 mm, the situation corresponds essentially to a situation with the tuning electrode (40) absent.

Example 4

Figure 9:
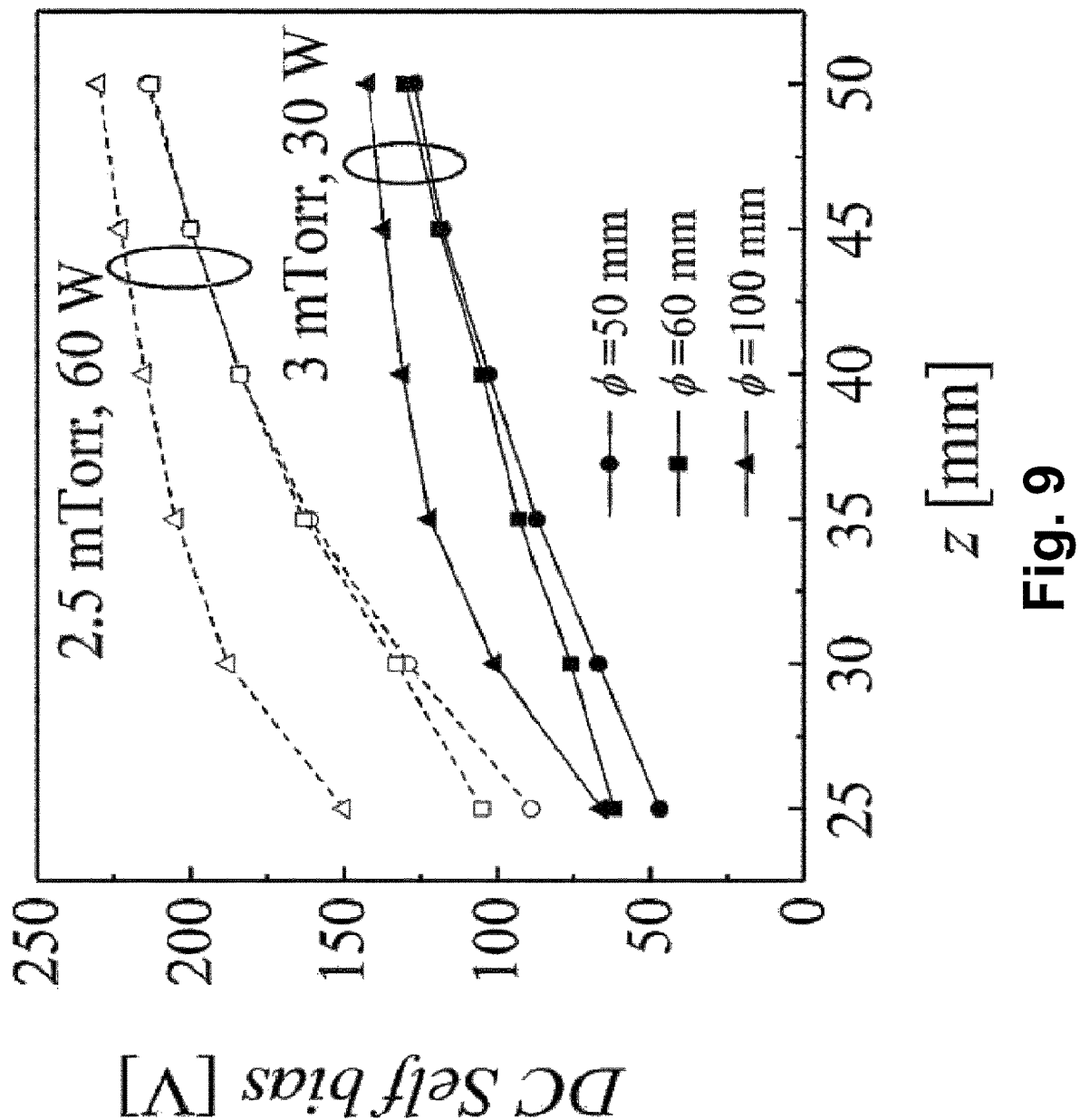
FIG. 9: Ex. 4-DC self-bias vs z=($D_1$-$D_2$) graph.

In Example 4 and FIG. 9 is reported the DC self-bias as a function of z=D1−D2 for 30 W (3 mTorr, closed captions) and 60 W (2.5 mTorr, open captions) for a tuning electrode bias $V_T$=0 V, measured with a 50 mm in diameter Al doped ZnO target (2% Aluminum) in an Ar-atmosphere at 30 and 60 W power at 13.56 MHz, in a standard configuration with tuning electrode (see FIG. 4) for three different aperture (41) openings (Φ) (▲) (Φ) 100 mm, (■) (Φ) 60 mm, and (●) (Φ) 50 mm. The pressures correspond to the minimum DC self-bias pressures presented in FIG. 8.

The measurements show that the negative ion energy increases with target to substrate distance.

Example 5

Figure 10:
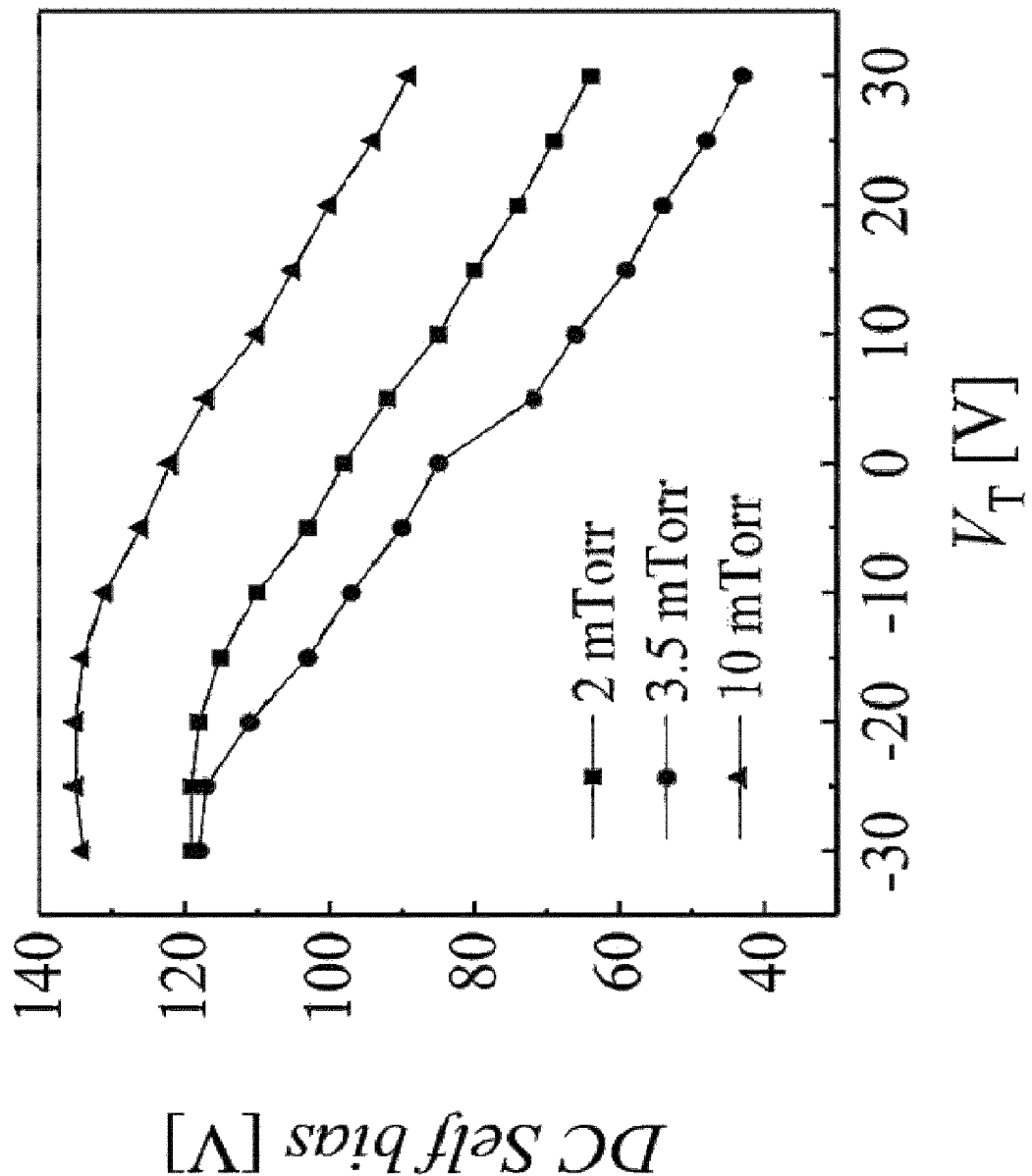
FIG. 10: Ex. 5-DC self-bias vs tuning bias $V_T$ graph.

In Example 5 and FIG. 10 is reported the DC self-bias as a function of the tuning electrode bias $V_T$ measured with a 50 mm in diameter Al doped ZnO target (2% Aluminum) in an Ar-atmosphere at 20 W power at 13.56 MHz, in a standard configuration with tuning electrode (see FIG. 4) at three different fixed pressures (■) 2 mTorr, (●) 3.5 mTorr, and (▲) 10 mTorr.

The measurement shows the possibility to further decrease the self-bias by increasing the tuning electrode bias $V_T$ for compensation of the self-bias.

Example 6

Figure 11:
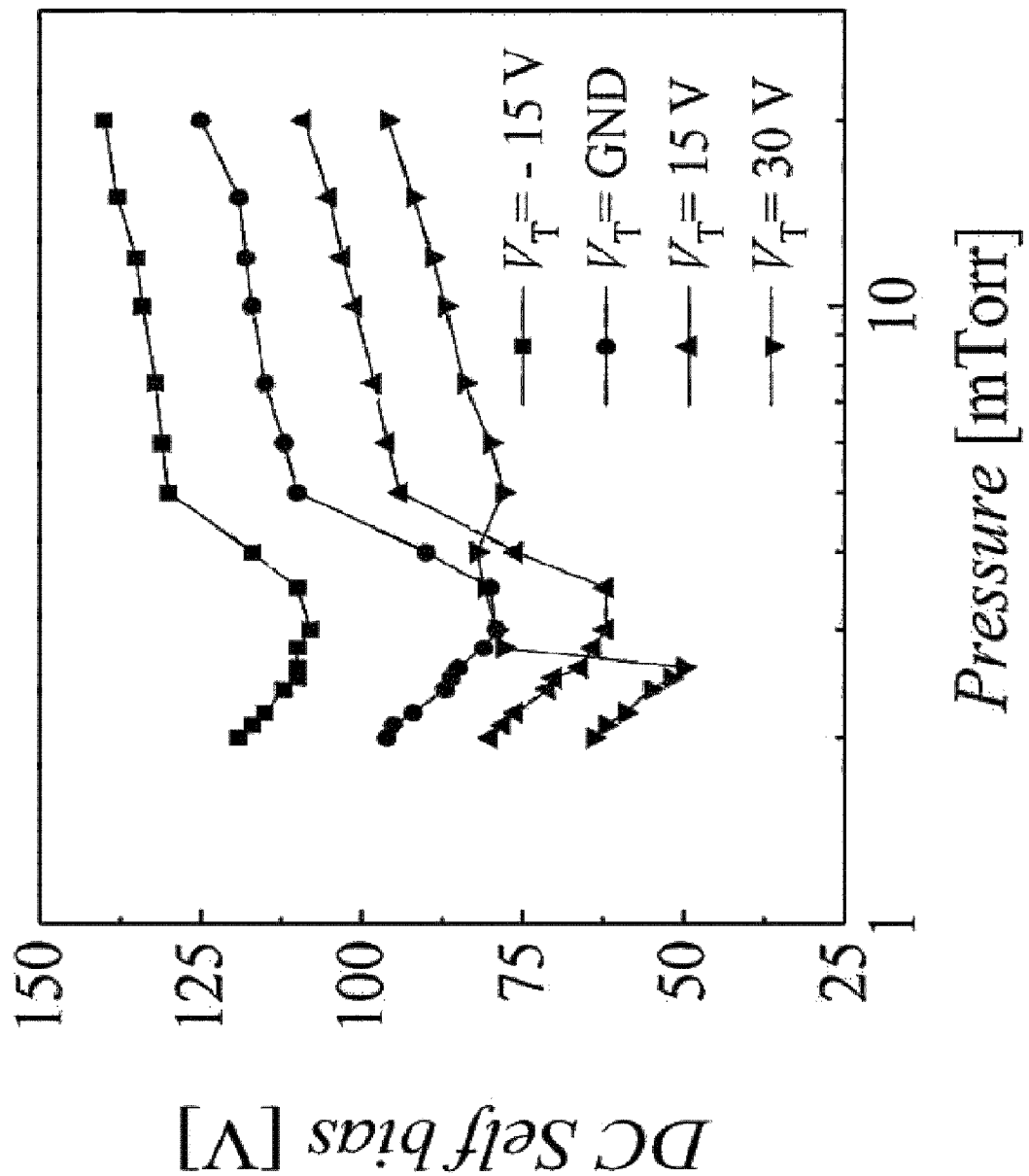
FIG. 11: Ex. 6-DC self-bias vs Vacuum-pressure graph.

In Example 6 and FIG. 11 is reported the DC self-bias as a function of varying pressure measured with a 50 mm in diameter Al doped ZnO target (2% Aluminum) in an Ar-atmosphere at 20 W power at 13.56 MHz, in a standard configuration with tuning electrode (see FIG. 4) for 4 different tuning electrode bias $V_T$ (■) $V_T$−15 V, (●) $V_T$ GND, (▲) $V_T$ 15 V, and (▼) $V_T$ 30 V.

The measurement shows that the lowest self-bias is obtained for $V_T$ 30 V. However, the discharge is not stable under the given experimental conditions, which causes $V_T$ to increase to about 20 V.

Example 7

Figure 12:
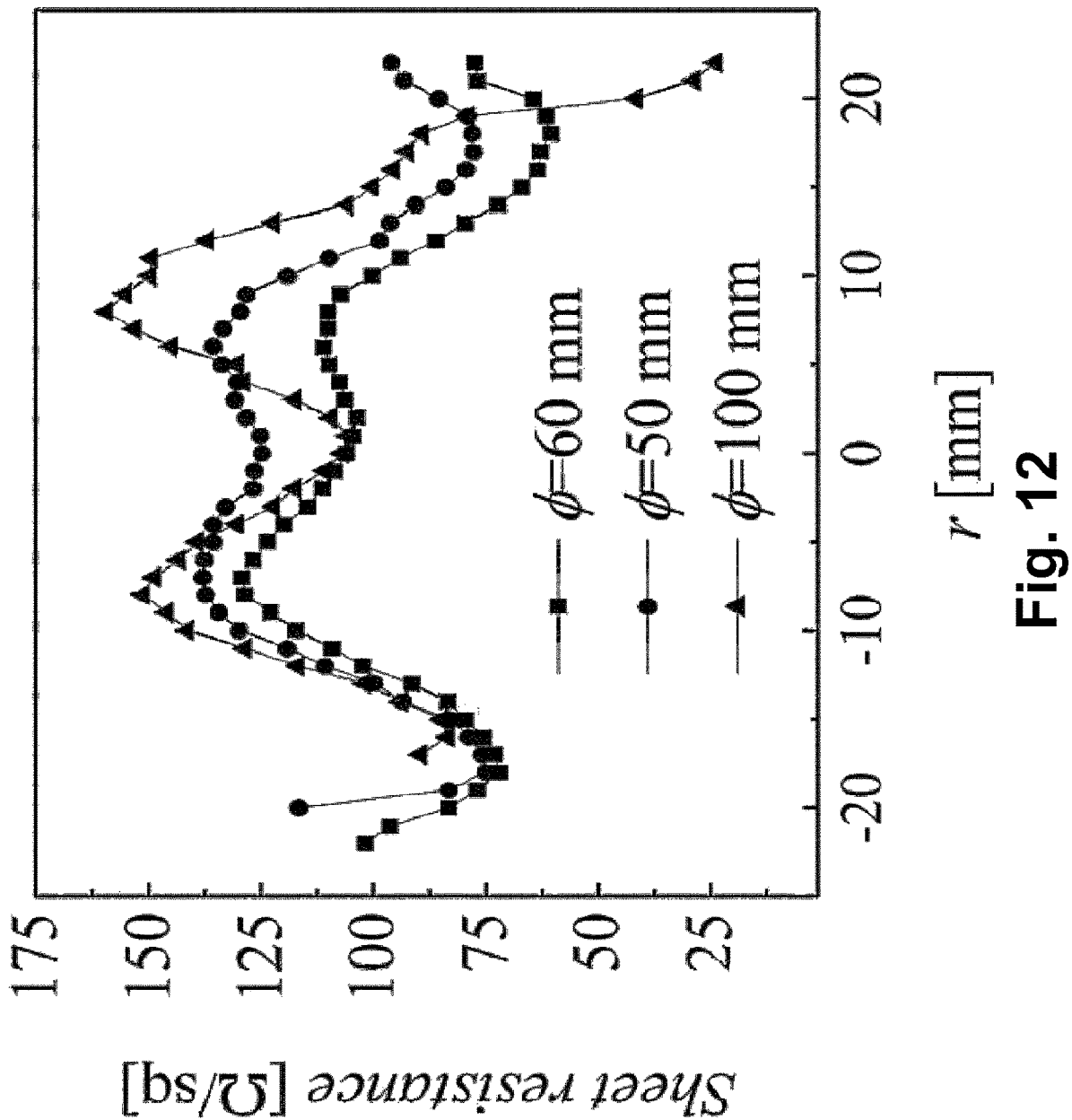
FIG. 12: Ex. 7-Sheet resistance [Ω/sq] vs radial pos. [r] graph.

In Example 7 and FIG. 12 is reported sheet resistance [Ω/sq] as a function of radial position [r] over a glass sample surface for three different aperture (41) openings (Φ), at 3 mTorr discharge pressure, 30 W RF power at 13.56 MHz, 30 min deposition time, $V_T$ 0 V, $D_1$ 35 mm, $D_2$ 10 mm, measured with a 50 mm in diameter Al doped ZnO target (2% Aluminum) in an Ar-atmosphere. The aperture (41) openings (Φ) were (▲) (Φ) 100 mm, (■) (Φ) 60 mm, and (●) (Φ) 50 mm.

The measurements showed lowest sheet resistance for (Φ) 60 mm. The measurements also revealed a correlation of sheet resistance with the erosion tracks (around −10 and 10 mm for z) where the negative ion flux is higher, making the deposited layer inhomogeneous.

Such inhomogeneity can easily be overcome by rotating the samples (31) or sputtering target (22) during depositing, such as by using rotating means (35a,35c) arranged with the sample holder (30) or the sputtering head (20). Preferably, however, a translational component is also included into the movement of sample (31) respectively sputtering target (22) for improving the homogeneity of the deposited sample layer. Separate translation means (not shown in the figures) should then be arranged on either the sample holder (30) or the sputtering head (20). Alternatively, the rotation and translation means could be combined such as in providing e.g. eccentric or elliptical rotation of sample holder (30) or sputtering head (20).

Example 8

Figure 13:
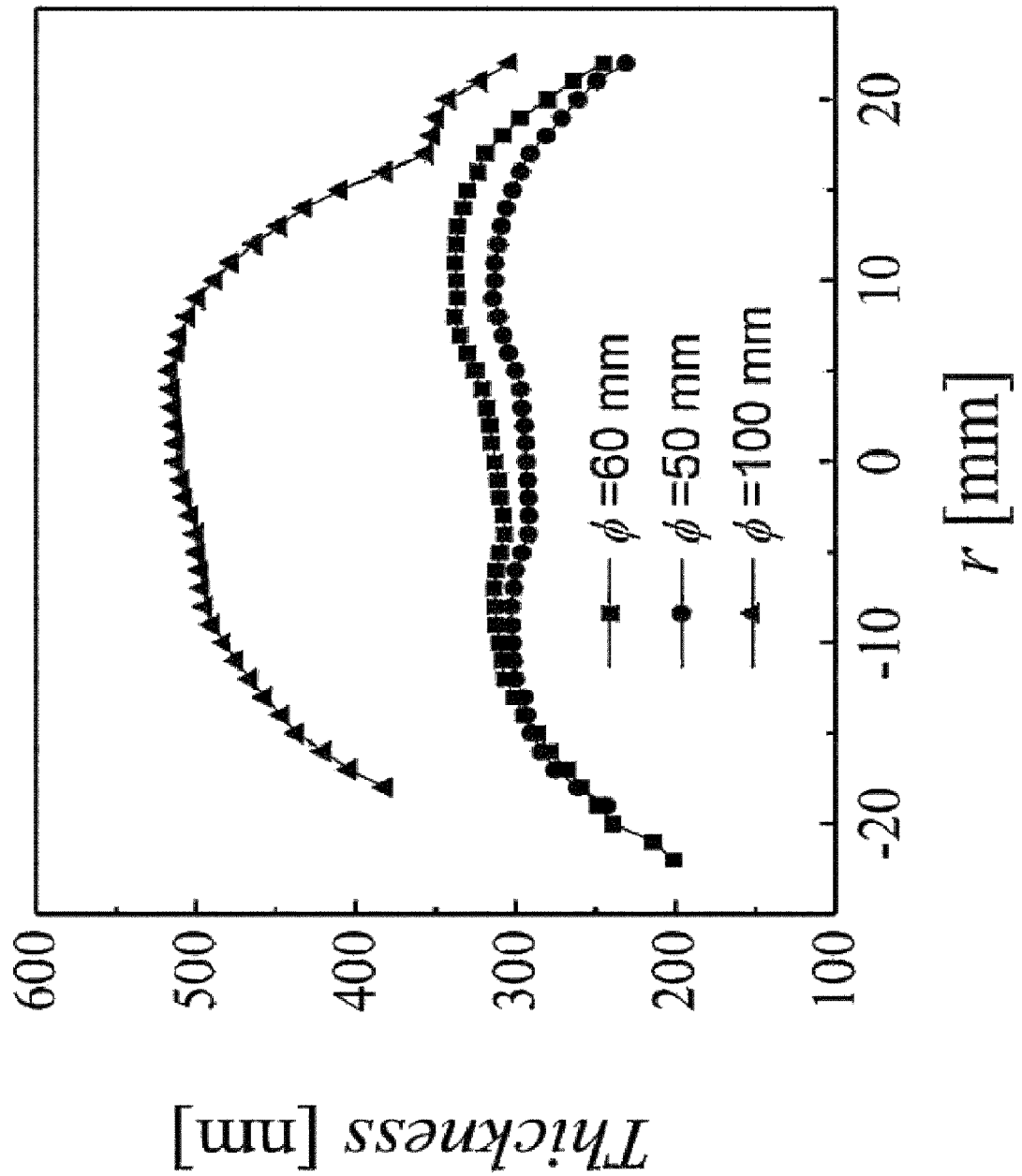
FIG. 13: Ex. 8-Thickness [mm] vs radial position [r] graph.

In Example 8 and FIG. 13 is reported for the same samples as in Example 7, the thickness [mm] as a function of radial position [r] over a glass sample surface for three different aperture (41) openings (Φ), at 3 mTorr discharge pressure, 30 W RF power at 13.56 MHz, 30 min deposition time, $V_T$ 0 V, $D_1$ 35 mm, $D_2$ 10 mm, measured with a 50 mm in diameter Al doped ZnO target (2% Aluminum) in an Ar-atmosphere. The aperture (41) openings (Φ) were (▲) (Φ) 100 mm, (■) (Φ) 60 mm, and (○) (Φ) 50 mm.

The measurements show that the absence of a tuning electrode creates a thicker film associated with a large plasma density. However, as shown in Example 3 and FIG. 8, this is negatively offset due to the higher energy for negative ions having negative impact on film properties.

An aperture opening slightly larger (Φ) 60 mm than the sample provides improvements to the thickness without compromising the sheet resistance as evidenced by Examples 7 and 8.

Example 9

Figure 14:
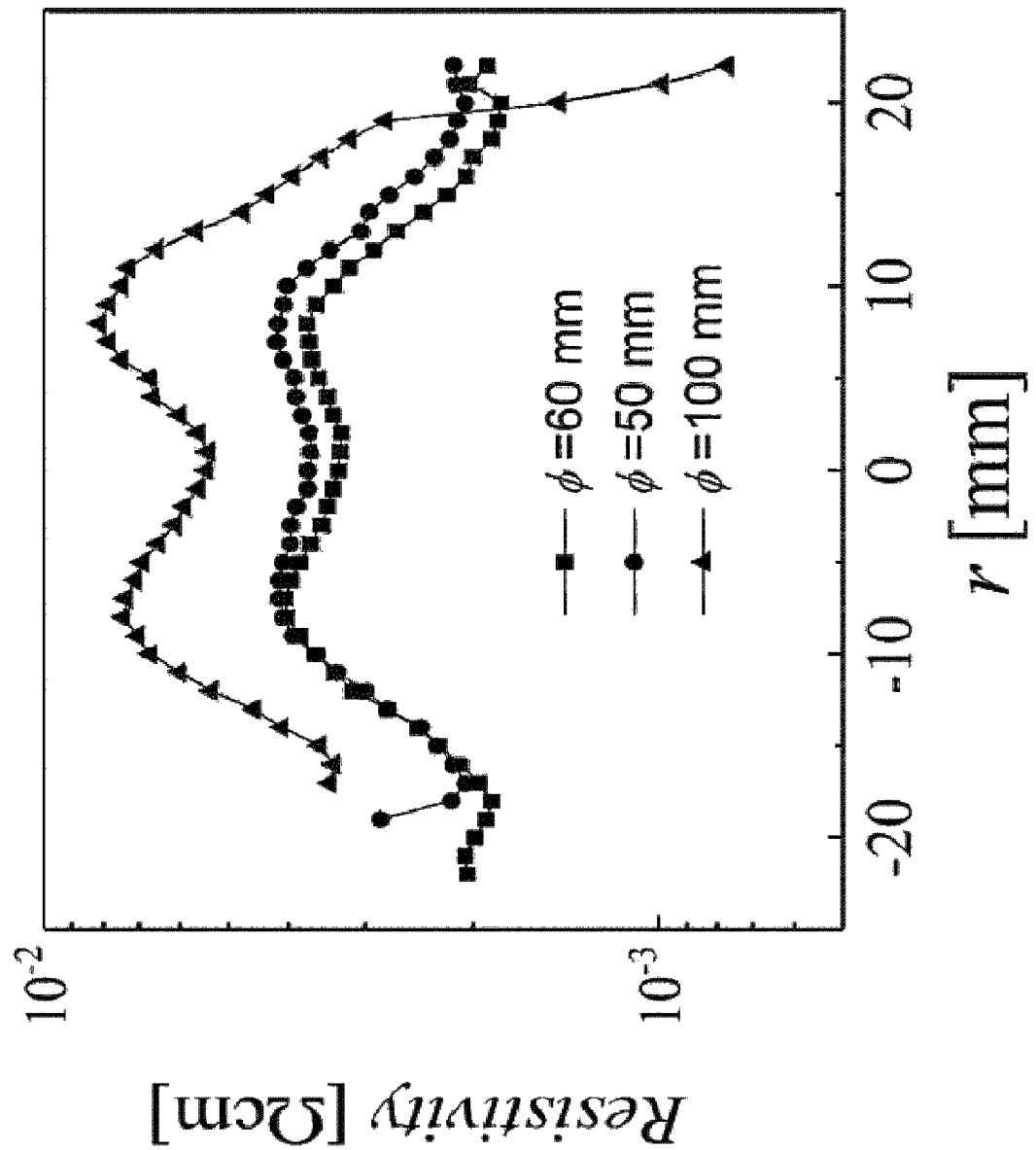
FIG. 14: Ex. 9-Resistivity [Ωcm] vs radial position [r] graph.

In Example 9 and FIG. 14 is reported for the same samples as in Example 7, the resistivity [Ωcm] as a function of radial position [r] as calculated from the data presented Examples 7 and 8 over a glass sample surface for three different aperture (41) openings (Φ), at 3 mTorr discharge pressure, 30 W RF power at 13.56 MHz, 30 min deposition time, $V_T$ 0 V, $D_1$ 35 mm, $D_2$ 10 mm, measured with a 50 mm in diameter Al doped ZnO target (2% Aluminum) in an Ar-atmosphere. The aperture (41) openings (Φ) were (▲) (Φ) 100 mm, (■) (Φ) 60 mm, and (●) (Φ) 50 mm.

The measurements of the radial distribution of the resistivity show that the tuning electrode (40) presence induces a reduction of the resistivity with a factor of 2.

As the samples have been deposited with no intentional heating of the substrate, the resistivity can be further decrease by annealing, which for glass substrates involves processes common to the skilled person for applications involving glass substrates such as low-emissivity coatings.

Example 10

Figure 15:
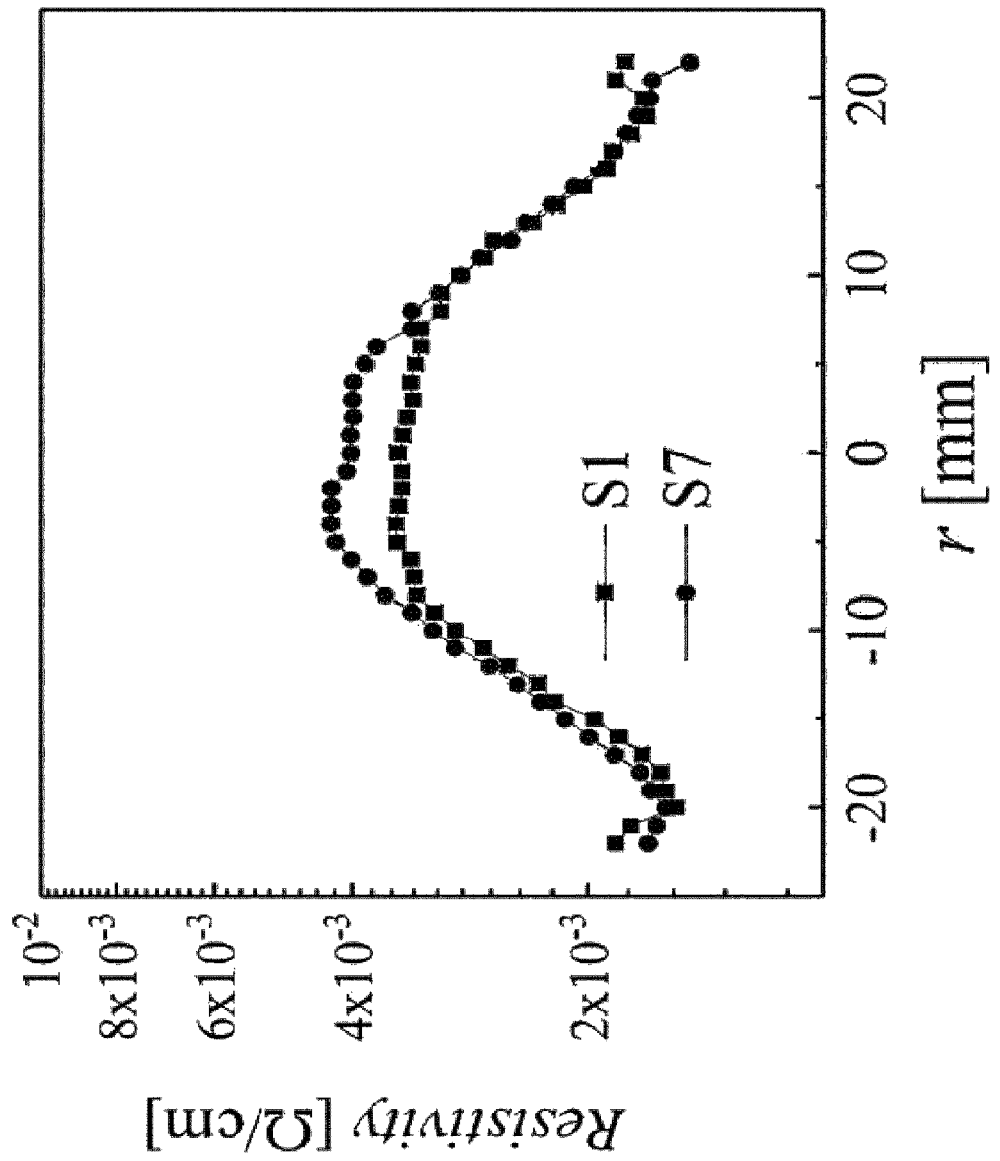
FIG. 15: Ex. 10-Resistivity [Ωcm] vs radial position [r] graph.

In Example 10 and FIG. 15 is reported the resistivity [Ωcm] as a function of radial position [r] for two different samples deposited in similar conditions but at different times on glass sample surfaces. Pressure: 3 mTorr, RF power: 30 W at 13.56 MHz, deposition time 60 min, D1 35 mm, D1 10 mm, DC self-bias 91 V, 50 mm in diameter Al doped ZnO target (2% Aluminum), Ar-atmosphere, (Φ) 60 mm (■) position S1, (●) position S7 cf. FIG. 4.

Example 11

Figure 16:
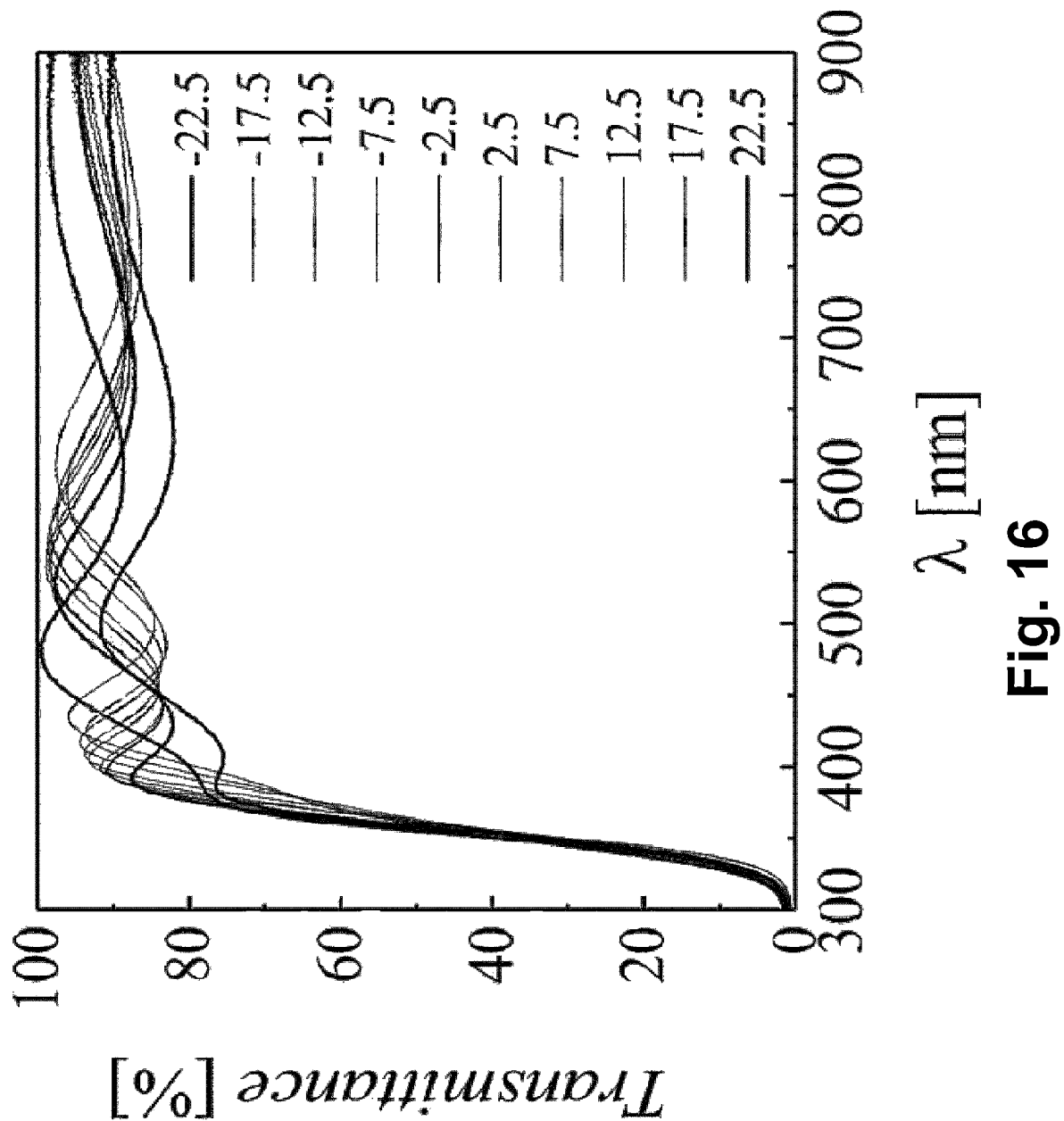
FIG. 16: Ex. 11-Transmittance vs radial position [r] graph.

In Example 11 and FIG. 16 is reported the transmittance as a function of radial position [r] for sample S1 deposited in Example 10 on a glass sample surface. Pressure: 3 mTorr, RF power: 30W at 13.56 MHz, deposition time 60 min, D1 35 mm, D1 10 mm, DC self-bias 91 V, 50 mm in diameter Al doped ZnO target (2% Aluminum), Ar-atmosphere, (Φ) 60 mm. High transmittance in the entire visible spectrum is observed.

Example 12

Figure 17:
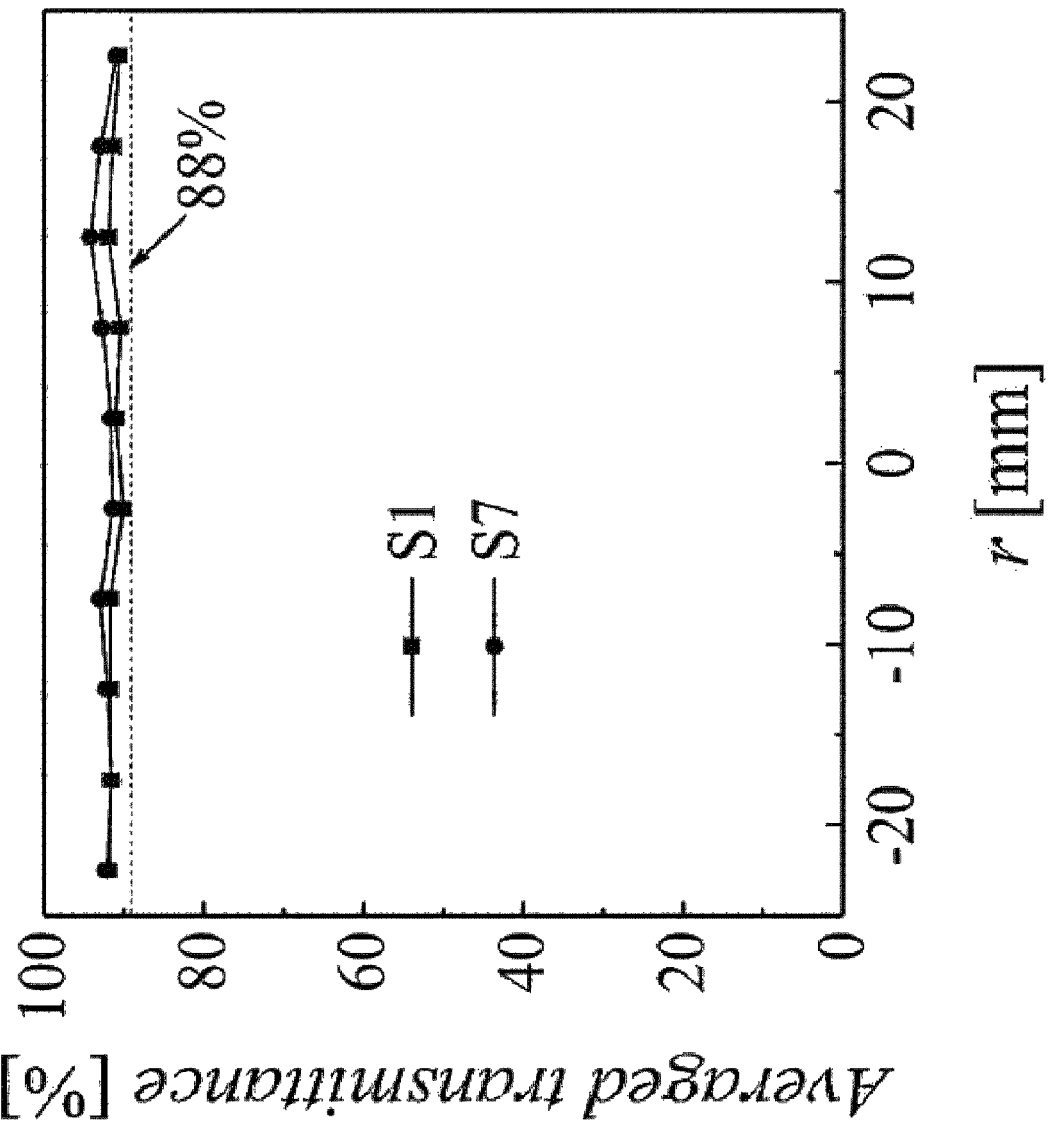
FIG. 17: Ex. 12-Average transmittance vs radial pos. [r] graph.

In Example 12 and FIG. 17 is reported the averaged transmittance as a function of radial position [r] for samples S1 and S7 deposited in Example 10 on a glass sample surfaces. Pressure: 3 mTorr, RF power: 30W at 13.56 MHz, deposition time 60 min, D1 35 mm, D1 10 mm, DC self-bias 91 V, 50 mm in diameter Al doped ZnO target (2% Aluminum), Ar-atmosphere, (Φ) 60 mm. (■) position S1, (●) position S7 cf. FIG. 4.

High transmittance exceeding 88% in the entire visible spectrum is observed for all observed radial values.

Example 13

Figure 18:
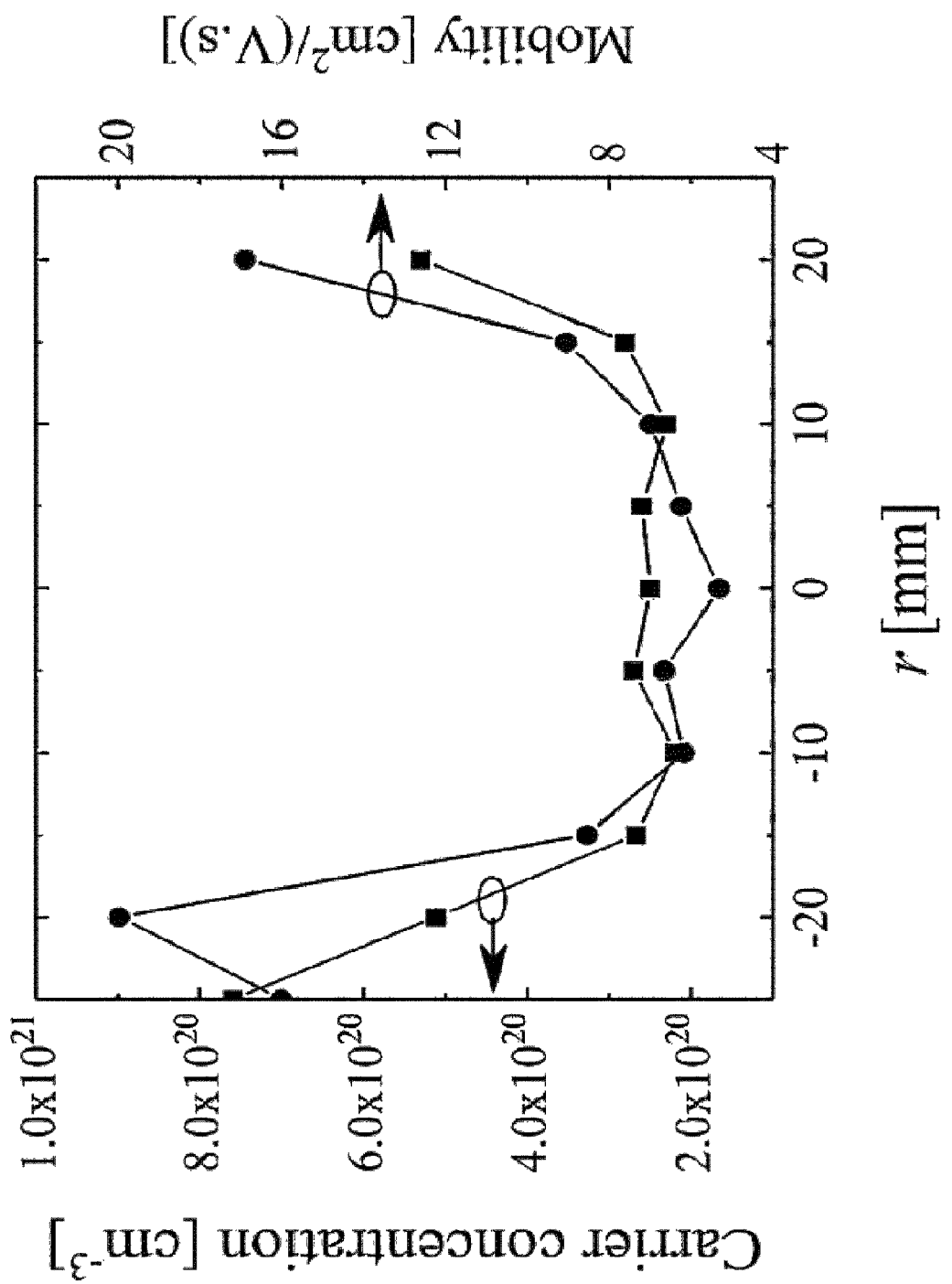
FIG. 18: Ex. 13-Carrier mobility and concentration vs. radial position [r] graph.

In Example 13 and FIG. 18 is reported the electron mobility and carrier concentration as a function of radial position [r] for sample S1 deposited in Example 10 on a glass sample surface. Pressure: 3 mTorr, RF power: 30W at 13.56 MHz, deposition time 60 min, D1 35 mm, D1 10 mm, DC self-bias 91 V, 50 mm in diameter Al doped ZnO target (2% Aluminum), Ar-atmosphere, (Φ) 60 mm.

High values for the electron mobility and carrier concentration are observed for all radial distributions. As expected, mobility and carrier concentration scales reversely with layer thickness (compare Example 10 and FIG. 15).

REFERENCES

[1] A. Bikowski, T. Welzel, Klaus Ellmer, *The impact of negative oxygen ion bombardment of electronic and structural properties of magnetron sputtered ZnO:Al films,* Applied Physics Letters, 102, 242106 (2013).

[2] A. Bikowski, T. Welzel, Klaus Ellmer, *The correlation between the radial distribution of high-energetic ions and the structural as well as electrical properties of magnetron sputtered ZnO:Al films,* Journal of Applied Physics, 114, 223716 (2013).

[3] M. Mickan, U. Helmesson, H. Rinnert, J. Ghanbaja, D. Muller, D. Horwat, *Room temperature deposition of homogenous, highly transparent and conductive Al-doped ZnO films by reactive high power impulse mag-* netron sputtering, Solar Energy Materials & Solar Cells, 157, pp 742-749 (2016).

[4] V. Tiron, L. Sirghi, G. Popa, *Control of aluminium doping of ZnO:Al thin films obtained by high-power impulse magnetron sputtering*, Thin Solid Films, 520 (13), pp 4305-4309 (2012).

[5] M. Mickan, *Deposition of Al-doped ZnO films by high power impulse magnetron sputtering*, Linköping University Studies in Science and Technology, Dissertation No. 1889 (2017).

[6] N-J. Choi, K-W. Kim, H-S. Son, S-N. Lee, *Optical and Electrical Characterization of AZO Films Grown on c-Plane Sapphire Substrates by Atomic Layer Deposition*, Electron. Mater. Lett., 10(1), pp 259-262 (2014).

[7] M. Nasiri, S. M. Rozati, *Muscovite mica as a flexible substrate for transparent conductive AZO thin films deposited by spray pyrolysis*, Materials Science in Semiconductor Processing, 81, pp 38-43 (2018).

[8] A. Illiberi, R. Scherpenborg, Y. Wu, F. Roozeboom, P. Poodt, *Spatial Atmospheric Atomic Layer Deposition of $Al_xZn_{1-x}O$*, Applied Materials & Interfaces, 5, pp 13124-13128 (2013).

[9] T. Dhakal, A. S. Nandur, R. Christian, P. Vasekar, S. Desu, C. Westgate, D. I. Koukis, D. J. Arenas, D. B. Tanner, *Transmittance from visible to mid-infrared in AZO films grown by atomic layer deposition system*, Solar Energy, 86, pp 1306-1312 (2012).

[10] A. Anders, J. Brown, *A Plasma Lens for Magnetron Sputtering*, IEEE Transactions on Plasma Science, 39(11), pp 2528-2529 (2011).

[11] B. Chapman, *Glow Discharge Processes: Sputtering and Plasma Etching*, John Wiley & Sons Inc., 1980.

Closing Comments

The term "comprising" as used in the claims does not exclude other elements or steps. The term "a" or "an" as used in the claims does not exclude a plurality. A single processor or other unit may fulfill the functions of several means recited in the claims.

Although the present invention has been described in detail for purpose of illustration, it is understood that such detail is solely for that purpose, and variations can be made therein by those skilled in the art without departing from the scope of the invention.

The invention claimed is:

1. A magnetron plasma sputtering arrangement comprising:
an evacuable chamber operatively coupled to a pumping system for generating a vacuum and a pressure and gas flow control;
a sputtering head arranged, in the evacuable chamber, wherein the sputtering head comprises:
a grounded anode; and
a sputtering cathode comprising:
a sputtering target; and
magnets for enhancing a plasma produced at the sputtering target, the sputtering target operatively connected to an RF power supply for producing a plasma at the sputtering target and releasing plasma sputtered material from a sputtering target surface;
a substrate holder for a substrate for receiving plasma sputtered material on a surface of the substrate, thereby forming a thin film of plasma sputtered material on the surface of the substrate;
a tuning electrode configured to adjust a DC self-bias and operatively connected to a biasing source with respect to ground, wherein the tuning electrode defines only a single aperture defining at least one axis of length arranged in a flow path for plasma between the sputtering cathode and the substrate, such that a plasma sputtered material originating at the sputtering target will traverse the aperture before depositing onto the surface of the substrate as a thin film;
wherein a size of the aperture and the at least one axis of length of the aperture are matched to a size of the sputtering target such that a cross-sectional area defined by the aperture is less than or equal to 1.5 times a cross-sectional area defined by the sputtering target.

2. The magnetron plasma sputtering arrangement according to claim 1, further comprising a repositioner arranged within the evacuable chamber such that the tuning electrode can be repositioned with respect to the sputtering target and the substrate by controlling a first distance between the sputtering target and the substrate and a second distance between the tuning electrode and the substrate.

3. The magnetron plasma sputtering arrangement according to claim 2, further comprising: a second repositioner upon which sputtering head is arranged for independent repositioning of the sputtering head with respect to the first distance and/or the second distance; and wherein the tuning electrode is arranged on the repositioner for independent repositioning of the tuning electrode with respect to the first distance and/or the second distance.

4. The magnetron plasma sputtering arrangement according to claim 3, wherein the repositioner comprises an axis of displacement and/or an axis of rotation with respect to the first distance and the second distance.

5. The magnetron plasma sputtering arrangement according to claim 4, wherein the repositioner comprises the axis of displacement and the second repositioner comprises a second axis of displacement that is parallel with the axis of displacement.

6. The magnetron plasma sputtering arrangement according to claim 4, wherein the repositioner comprises the axis of rotation and the second repositioner comprises a second axis of rotation that rotates in parallel to the axis of rotation.

7. The magnetron plasma sputtering arrangement according to claim 1, further comprising an aperture resizer arranged within the evacuable chamber for resizing the at least one axis of length of the aperture.

8. The magnetron plasma sputtering arrangement according to claim 7, wherein the aperture resizer is a diaphragm.

9. The magnetron plasma sputtering arrangement according to claim 8, wherein the diaphragm is an iris diaphragm.

10. The magnetron plasma sputtering arrangement according to claim 2, further comprising: a second repositioner upon which the substrate holder is arranged for independent repositioning of the substrate holder with respect to the first distance and/or the second distance; and wherein the tuning electrode is arranged on the repositioner for independent repositioning of the tuning electrode with respect to the first distance and/or the second distance.

11. The magnetron plasma sputtering arrangement according to claim 10, wherein the repositioner comprises an axis of displacement and/or an axis of rotation with respect to the first distance and/or the second distance.

12. The magnetron plasma sputtering arrangement according to claim 11, wherein the repositioner comprises the axis of displacement and the second repositioner comprises a second axis of displacement that s parallel with the axis of displacement.

13. The magnetron plasma sputtering arrangement according to claim 11, wherein the repositioner comprises the axis of rotation and the second repositioner comprises a second axis of rotation that rotates in parallel to the axis of rotation.

14. The magnetron plasma sputtering arrangement according to claim 10, further comprising: a third repositioner upon which the sputtering head is arranged for independent repositioning of the sputtering head with respect to the first distance and/or the second distance.

\* \* \* \* \*